US006420091B1

(12) United States Patent
Nakayama et al.

(10) Patent No.: US 6,420,091 B1
(45) Date of Patent: Jul. 16, 2002

(54) METHOD OF PRODUCING LITHOGRAPHIC PRINTING PLATE

(75) Inventors: Takao Nakayama; Satoshi Hoshi, both of Shizuoka; Nobufumi Mori; Takashi Nakamura, both of Kanagawa, all of (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 87 days.

(21) Appl. No.: 09/679,351

(22) Filed: Oct. 5, 2000

(30) Foreign Application Priority Data

Oct. 8, 1999 (JP) .......................................... 11-288171

(51) Int. Cl.[7] ................................................ G03F 7/09

(52) U.S. Cl. ......................... 430/302; 430/19; 430/138; 430/270.1; 430/303; 430/328; 430/348; 430/394; 430/494; 430/944; 430/945; 430/964; 101/453; 101/456; 101/458; 101/459; 101/463.1; 101/467; 101/478

(58) Field of Search ....................... 430/19, 138, 270.1, 430/300, 302, 303, 328, 348, 394, 494, 944, 945, 964; 101/453, 456, 458, 459, 463.1, 466, 467, 478

(56) References Cited

U.S. PATENT DOCUMENTS

| | | | | | |
|---|---|---|---|---|---|
| 5,988,066 | A | * | 11/1999 | Robinson et al. | 101/457 |
| 6,048,654 | A | * | 4/2000 | Nakayama et al. | 430/19 |
| 6,082,263 | A | * | 7/2000 | Koguchi et al. | 101/456 |
| 6,258,512 | B1 | * | 7/2001 | Kasai et al. | 430/302 |
| 2001/0006757 | A1 | * | 7/2001 | Fukino et al. | 430/270.1 |
| 2001/0024766 | A1 | * | 9/2001 | Kita et al. | 430/272.1 |
| 2001/0036592 | A1 | * | 11/2001 | Hoshi et al. | 430/270.1 |
| 2002/0000176 | A1 | * | 1/2002 | Mori et al. | 430/302 |
| 2002/0009574 | A1 | * | 1/2002 | Hiraoka | 428/158 |

* cited by examiner

*Primary Examiner*—Janet Baxter
*Assistant Examiner*—Barbara Gilmore
(74) *Attorney, Agent, or Firm*—Burns, Doane, Swecker & Mathis, LLP

(57) ABSTRACT

A method of producing a lithographic printing plate which comprises subjecting a printing plate precursor comprising a support having a metallic compound layer which has a photo-catalytic property and a hydrophilic surface and bears light-heat convertible minute particles on the surface thereof to imagewise irradiation of heat mode to convert polarity of the metallic compound layer, thereby forming an imagewise hydrophobic region. The lithographic printing plate can be repeatedly employed.

8 Claims, 1 Drawing Sheet

METHOD OF PRODUCING LITHOGRAPHIC PRINTING PLATE

FIELD OF THE INVENTION

Figure 1:
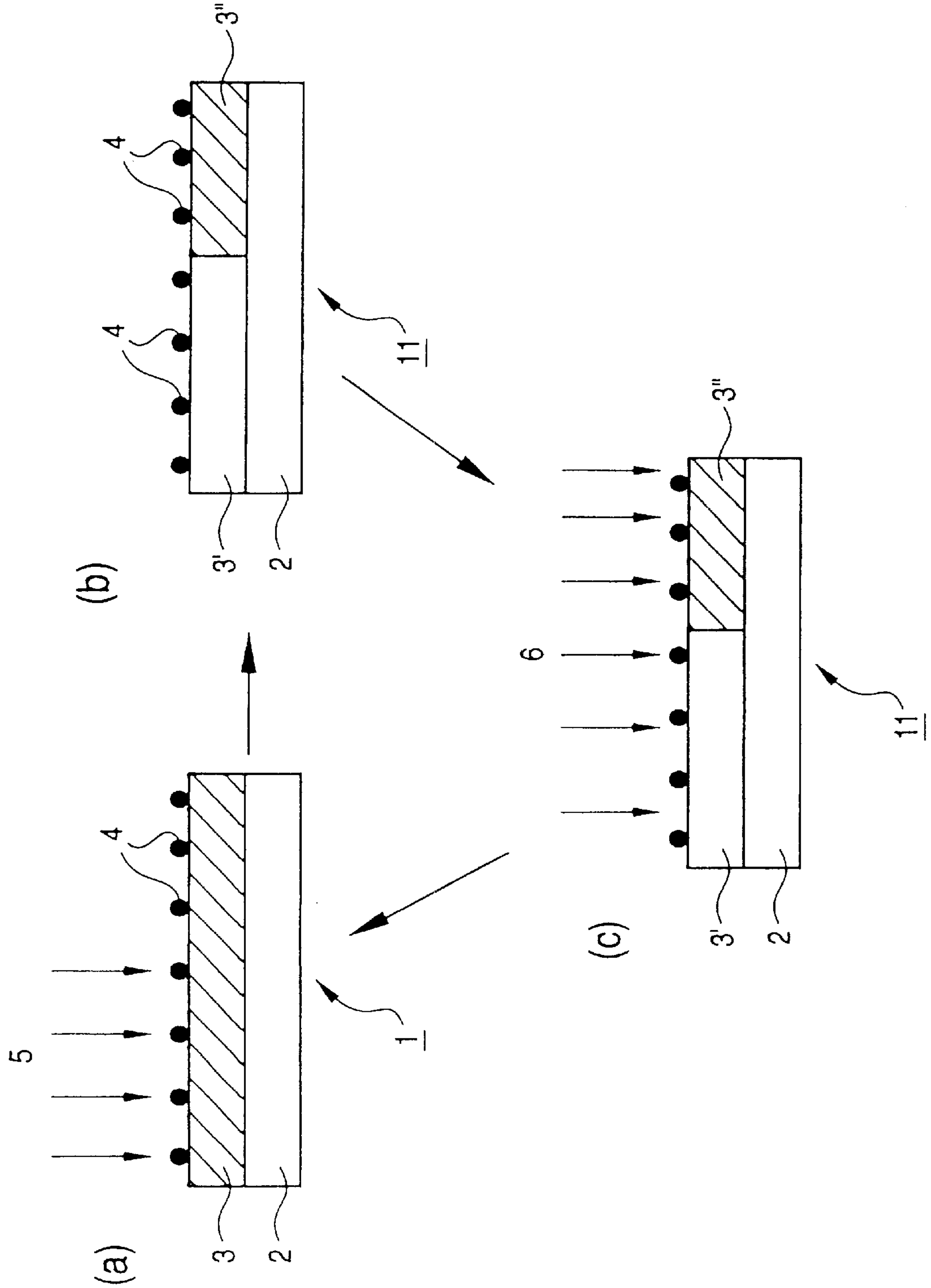

The present invention relates to a method of producing a lithographic printing plate which is excellent in press life, without undergoing development processing. More particularly, it relates to a method of producing a lithographic printing plate wherein plate-making is conducted by heat mode image recording, the image recording can be carried out scanning exposure based on digital signals, development processing is eliminated, the plate-making is performed on a printing machine and followed by printing as it is, and the resulting printing plate is reusable.

BACKGROUND OF THE INVENTION

Among various printing methods, a lithographic printing method, particularly, an offset printing method has been conventionally employed and is, at present, one of the main printing methods since a manufacturing process of a printing plate used therefor is simple. The offset printing technique is based on the incompatibility of oil and water. An oily material, i.e., ink, is selectively retained in an image area and dampening water is selectively retained in a non-image area. By bringing an ink carrying-printing plate into contact with a material to be printed directly or indirectly via an intermediate which is called a blanket, the ink on the image area is transferred to the material to be printed, thereby conducting the printing.

In the offset printing method, a PS plate comprising an aluminum substrate as a support having coated thereon a diazo photosensitive layer is mainly used. The aluminum support of a PS plate is subjected to surface-graining, anodizing or other various treatments to promote the ink receptivity of the image area and ink repellency of the non-image area. Thus, a printing plate obtained can have an accurate image on the substrate and exhibit improved press life. Accordingly, the offset printing method is provided with good press life and highly accurate image in addition to simplicity.

However, further simplification of the offset printing method has been required with the prevalence of printed matter and a variety of simple printing methods have been proposed.

A typical example is a printing method including a method of manufacturing a printing plate by means of a silver salt diffusion transfer process as described, for example, in U.S. U.S. Pat. No. 3,511,656 and JP-A-7-56351 (the term "JP-A" as used herein means an "unexamined published Japanese patent application"). Such a type of printing plate is also commercially available from Agfa-Gevaert N.V. as Copyrapid offset printing plate. According to the method, a transfer image which is oleophilic can be formed through one step and can be used as a printing plate as it is. Thus, the method is practically used as a simple printing method. Although the method is simple, it still includes a diffusion transfer development step with an alkaline developing solution. Therefore, a simpler printing method which dose not contain a development step with a developing solution has been demanded.

Under such circumstances, various investigations to provide a simple method of manufacturing a printing plate without performing a development step with an alkaline developing solution after imagewise exposure has been made. Such a type of printing plate is called a processless printing plate in the field of a simple printing plate since a development step can be eliminated. Many methods based on various principles, for example, (1) image formation by thermal destruction of an irradiated part on an image recording surface by imagewise exposure, (2) image formation by oleophilization due to heat mode curing of an irradiated part by imagewise exposure, (3) image formation by oleophilization due to light mode curing of an irradiated part by imagewise exposure, (4) change of surface property by photolysis of a diazo compound, and (5) heat transfer of an image area by heat mode melting have been proposed.

The simple offset printing methods described above include techniques described, for example, in U.S. Pat. Nos. 3,506,779, 3,549,733, 3,574,657, 3,739,033, 3,832,948, 3,945,318, 3,962,513, 3,964,389, 4,034,183, 4,081,572, 4,693,958, 4,731,317, 5,238,778, 5,353,705, 5,385,092, 5,395,729 and European Patent 1,068.

Although these techniques do not need a developing solution at plate-making, they have at least one of the drawbacks in that the difference between an oleophilic area and a hydrophilic area is insufficient, consequently an image quality of a printed image is inferior, in that a resolving power is poor, consequently a printed image having excellent sharpness can hardly be obtained, in that an image portion is insufficient in mechanical strength and is liable to be damaged, resulting in the necessity of providing a protective film, consequently the simplicity is rather lost, and in that the durability capable of enduring long term printing is insufficient. These facts show that only the elimination of an alkaline developing step does not lead to the solution of the problem. Therefore, a method for making a printing plate which fulfills characteristics required for printing and can easily produce a printing plate has been strongly desired. However, such a method has not been realized yet.

Another method of producing a processless printing plate is a method utilizing zirconia ceramic which is rendered hydrophilic upon irradiation with light as described in JP-A-9-169098. However, since the zirconia ceramic has a low photosensitivity and the light conversion effect from hydrophobicity to hydrophilicity is insufficient, discrimination of an image area from a non-image area is unsatisfactory.

In addition to the simple plate-making method which does not use a developing solution as described above, development of means for treating a printing plate used to reclaim a printing plate precursor and reuse is advantageous to decrease in cost and reduction of waste matters. In order to reclaim and reuse a printing plate precursor, simplicity of operation for the reclamation is important in view of practical use. However, since development of the simple operation for the reclamation is accompanied with various difficulties, it has been hardly given serious consideration, and only such a method is proposed with respect to a special material for a printing plate precursor which is called zirconia ceramic in JP-A-9-169098 as described above.

SUMMARY OF THE INVENTION

Therefore, an object of the present invention is to solve the problems on heat mode plate-making process described above and to achieve improvements in characteristics.

Specifically, an object of the present invention is to provide a method of producing a lithographic printing plate of heat mode type wherein development processing is not demanded, the plate-making is simple, a printing plate precursor can be directly mounted on a printing machine for the plate-making, and a printing plate which is excellent in press life and provides printed matter of less stain is produced.

Another object of the present invention is to provide a method of producing a lithographic printing plate of heat mode type wherein the plate-making is easily conducted by a scanning image exposure system using a laser beam and a printing plate having excellent discrimination of an image area from a non-image area.

A further object of the present invention is to provide a method of producing a lithographic printing plate which can be reclaimed and used repeatedly.

Other objects of the present invention will become apparent from the following description.

The present inventors found that when a metallic compound layer which has a photo-catalytic property and a hydrophilic surface and bears light-heat convertible minute particles on the surface thereof is subjected to irradiation of heat mode such as an infrared ray, an ink-receptive region (hydrophobic region) is formed by the action of heat received and the ink-receptive region (hydrophobic region) returns to the inherent hydrophilic region by irradiation with an active ray having a short wavelength, and as a result of extensive investigations they completed the present invention.

The present invention includes the following methods:

1. a method of producing a lithographic printing plate which comprises subjecting a printing plate precursor comprising a support having a metallic compound layer which has a photo-catalytic property and a hydrophilic surface and bears light-heat convertible minute particles on the surface thereof to imagewise irradiation of heat mode to convert polarity of the metallic compound layer, thereby forming an imagewise hydrophobic region,
2. the method of producing a lithographic printing plate as described in item 1 above, wherein the metallic compound layer which has a photo-catalytic property and a hydrophilic surface and bears light-heat convertible minute particles on the surface thereof is one formed by irradiating a metallic compound layer having a photo-catalytic property with an active ray in the presence of a water soluble salt of metal which constitutes the light-heat convertible minute particles,
3. the method of producing a lithographic printing plate as described in item 1 or 2 above, wherein a covering rate of the light-heat convertible minute particles born on the surface of the metallic compound layer which has a photo-catalytic property and a hydrophilic surface is in a range of from 0.01 to 10% of the surface of the metallic compound layer,
4. the method of producing a lithographic printing plate as described in any one of items 1 to 3 above, wherein the printing plate precursor is one formed by removing printing ink from a lithographic printing plate produced according to the method as described in any one of items 1 to 3 above after conducting printing, and then subjecting the metallic compound layer of the lithographic printing plate to overall irradiation with an active ray, thereby rendering the surface of the metallic compound layer hydrophilic, and
5. the method of producing a lithographic printing plate as described in any one of items 1 to 3 above, wherein the printing plate precursor is one formed by removing printing ink from a lithographic printing plate produced according to the method as described in any one of items 1 to 3 above after conducting printing, and then subjecting the metallic compound layer of the lithographic printing plate to heating at the high temperature generating hydrophilicity, thereby rendering the surface of the metallic compound layer hydrophilic.

BRIEF DESCRIPTION OF THE ACCOMPANYING DRAWINGS

In FIG. 1, (*a*) is a schematic cross sectional view showing one example of printing plate precursor.

In FIG. 1, (*b*) is a schematic cross sectional view showing a printing plate obtained by subjecting the printing plate precursor (a) to imagewise exposure.

In FIG. 1, (*c*) is a schematic cross sectional view showing irradiation the printing plate (b) with an active ray to reclaim a printing plate precursor.

In these figures, the numerals denote the following members, respectively:

1: Printing plate precursor

2: Support

3: Metallic compound layer

3': Metallic compound layer having a hydrophobic surface

3": Unirradiated portion of a metallic compound layer

4: Minute metal particle

5: Laser beam

6: Active ray

11: Printing plate

DETAILED DESCRIPTION OF THE INVENTION

One feature of the present invention is exploitation of the property of photo-catalytic metallic compound surface polarity of which changes from hydrophobicity to hydrophilicity upon irradiation with an active ray and the hydrophilic surface returns to hydrophobic by applying heat and the property of light-heat convertible material which absorbs light energy and converts to heat energy for the purpose of the formation of lithographic printing image. Thus, a photosensitive lithographic printing plate precursor capable of performing heat mode image recording is obtained. Specifically, when the metallic compound layer which has a photo-catalytic property and a hydrophilic surface and bears light-heat convertible minute particles on the surface thereof is irradiated, a temperature of the minute particles which absorb energy of the radiation on the surface of the metallic compound layer rises, and as a result, a hydrophilic surface of the metallic compound layer changes to hydrophobic due to the heat generated. By subjecting the lithographic printing plate precursor having the hydrophilic surface to imagewise irradiation, the imagewise hydrophobic region is formed.

The present inventors have been found that methods of producing a printing plate utilizing the polarity conversion of photo-catalytic metallic compound due to irradiation and heating as described in JP-A-11-105234, JP-A-11-174664, JP-A-11-174665 and JP-A-11-138970. In the present invention, on the other hand, the light-heat convertible material is employed in order to increase photosensitivity which brings about the polarity conversion. Thus, quality of the printed matter and press life are improved.

Another future of the present invention is exploitation of the phenomenon in that when the imagewise hydrophobic region formed by the imagewise irradiation described above is irradiated with an active ray having a short wavelength corresponding to a light-absorbing range of the photo-catalytic metallic compound layer, for example, an ultraviolet ray, the surface of the metallic compound layer in the hydrophobic region absorbed the actinic ray turns from hydrophobic to hydrophilic. Thus, after a printing plate produced by the imagewise irradiation is subjected to printing procedure, the printing plate is irradiated with an active ray so that the hydrophobic region is turned to a hydrophilic region, whereby a printing plate precursor is reproduced. The printing plate precursor can be repeatedly used.

The photo-catalytic metallic compound has the property in that it exhibits hydrophobicity by heating as described above. When the photo-catalytic metallic compound is heated over at a temperature generating hydrophobicity, it again exhibits hydrophilicity. Such a temperature is called a high temperature generating hydrophilicity. While the high temperature generating hydrophilicity may be varied depending on the kind or hysteresis of the metallic compound, it is generally 170° C. or more, usually 200° C. or more. According to the present invention, a printing plate used is subjected to heating at the high temperature generating hydrophilicity instead of subjecting to the irradiation with active ray, thereby reproducing a printing plate precursor having a hydrophilic surface. The printing plate precursor can be repeatedly used.

A further future of the present invention is a method of preparing the light-heat convertible minute particles. The inventors found that when the metallic compound layer having the photo-catalytic property coming into contact with a oxidizing metal salt is irradiated with an active ray, light-heat convertible minute metal particles are deposited on the surface of photo-catalytic metallic compound layer. According to the method, the metallic compound layer bearing the light-heat convertible minute particles can be prepared in an extremely simple manner. In this case, a material which is subjected to oxidation is present together with the metal salt which is subjected to reduction as described hereinafter.

While the above-described method of preparing minute metal particles on the photo-catalytic metallic compound layer by photo-catalytic reduction of the metal salt (which is subjected to reduction) is an advantageous method in the present invention, the light-heat convertible minute metal particles can be prepared by other methods, for example, vacuum deposition or spattering of light-heat convertible metal, or deposition of nonelectolyte on the photo-catalytic metallic compound layer by chemical reduction.

Further, the light-heat convertible minute particles for use in the present invention are not limited to the minute metal particles obtained by the photo-catalytic reduction, vacuum deposition, spattering or chemical reduction described above, and metallic compounds and pigments described hereinafter can be preferably employed for the light-heat convertible minute particles in the present invention.

Now, the method of the present invention will be described in more detail with reference to FIG. 1. A printing plate precursor 1 shown in FIG. 1(*a*) comprises a support 2 having provided thereon a metallic compound layer 3 having a photo-catalytic property and a hydrophilic surface, and on the surface of the metallic compound layer 3, light-heat convertible minute metal particles 4 are carried. The minute metal particles 4 are heated upon imagewise irradiation of a laser beam 5 represented by the arrow over the printing plate precursor 1 shown in FIG. 1(*a*). Due to the heat, the metallic compound layer 3 changes to a metallic compound layer having a hydrophobic surface 3', whereby a hydrophobic region is formed in the irradiated portion of the metallic compound recording layer of a printing plate 11 as shown in FIG. 1(*b*). A surface of metallic compound layer in the unirradiated portion 3" maintains the hydrophilicity.

When the printing plate 11 is subjected to irradiation with an active ray 6 such as an ultraviolet ray on the whole surface thereof as shown in FIG. 1(*c*), the surface of the metallic compound layer returns to hydrophilic. As a result, a printing plate precursor 1 is reclaimed and reused.

According to the method of the present invention, when a printing plate precursor comprising a support having a metallic compound layer which has a photo-catalytic property and a hydrophilic surface and bears light-heat convertible minute particles on the surface thereof is only subjected to imagewise irradiation of heat mode, the irradiated region changed to an ink-receptive imagewise hydrophobic region and a remarkable difference in the polarity from the unirradiated region of the image recording layer having a surface exhibiting hydrophilicity can be made. Thus, a printing plate which is excellent in press life and provides printed matter of less stain is produced in a simple manner without performing development processing. Further, after the printing plate is used, when it was irradiated with an active ray such as an ultraviolet ray or heated at a temperature generating hydrophilicity, the hydrophobic region changes to hydrophilic, thereby reclaiming a printing plate precursor which can be repeatedly used. This is advantageous in view of cost.

In order to repeatedly use the printing plate precursor many times, it is desired that the light-heat convertible minute particles be firmly bonded on the surface of the metallic compound layer. For such a purpose, it is effective that after bearing the light-heat convertible minute particles on the surface of the metallic compound layer, a printing plate precursor is subjected to heat treatment to strengthen the bond between both materials.

Embodiments of the present invention including the metallic compound layer having a photo-catalytic property, light-heat convertible minute particles, support, plate-making method, reclamation of printing plate precursor will be described in greater detail below. The metallic compound layer which has a photo-catalytic property and bears light-heat convertible minute particles is also called an image recording layer in the following description.

First, the terminology used in the present invention will be described. The term "active ray" means a ray which is absorbed by the photo-catalytic metallic compound to excite it and make the surface thereof hydrophilic. A light source and wavelength for the active ray will be described in detail hereinafter. The term "overall irradiation" means irradiation (exposure) of substantially uniform on the overall surface of a printing plate in which local unevenness is practically not recognized. On the other hand, the term "imagewise irradiation" means irradiation with a ray modulated so that the intensity of illumination on the irradiated surface has imagewise distribution. The term "heat mode" has the same meaning as used in the field of art. Specifically, in the field of art, an image recording method by means of heating is called a "heat mode" image recording method and includes one image recording method in which fine exothermic media are imagewise brought into contact with a material to form an image by means of the function of heat and the other image recording method utilizing a phenomenon in which the ray absorbed is converted to heat energy and as a result, the change brings about not photochemically but by means of the function of heat. The present invention utilize the latter image recording method. In the latter heat mode recording method, for example, an infrared ray, a visible ray of high intensity of illumination and a short time irradiation or a laser beam can be employed. Because the metallic compound layer may also be produced by vacuum deposition, it is also called "thin film of metallic compound" or "thin layer of metallic film".

Metallic Compound Layer Having a Photo-catalytic Property

Titanium oxide ($TiO_2$) for use in the present invention include titanium oxide produced by any known method, for example, baking of ilmenite or titanium slag with sulfuric acid or heat chlorination of ilmenite or titanium sludge and oxidation with oxygen. Any crystal form of titanium oxide can be employed. However, titanium oxide of anatase type is preferred because of its high sensitivity. The titanium oxide of anatase type can be obtained by appropriately selecting conditions during the baking process as well known in the art. Although the titanium oxide of anatase type may contain amorphous titanium oxide and/or titanium oxide of rutile type, it is preferred to use titanium oxide containing anatase type crystal in an amount of 40% by weight or more, preferably 60% by weight or more for the reason described above.

In $RTiO_3$, R represents a metal atom belonging to an alkaline earth group of the periodic table, for example, magnesium, calcium, strontium, barium or beryllium. Particularly, strontium and barium are preferred for R. Two or more kinds of the alkaline earth metal atoms are employed for R as long as the total number thereof coordinates stoichiometrically with the above-described formula.

In the compounds represented by formula $AB_{2-x}C_xD_{3-x}E_xO_{10}$, A represents a monovalent atom selected from a hydrogen atom and an alkali metal atom, for example, sodium, potassium, rubidium, cesium or lithium. Two or more kinds of the monovalent atoms are employed for A as long as the total number thereof coordinates stoichiometrically with the above-described formula.

B represents an alkaline earth metal atom or a lead atom. Two or more kinds of the atoms are employed for B as long as the total number thereof coordinates stoichiometrically with the above-described formula.

C represents a rare earth atom, and preferably includes scandium, yttrium and a lanthanum series atom such as lanthanum, cerium, praseodymium, neodymium, holmium, europium, gadolinium, terbium, thulium, ytterbium or lutetium. Two or more kinds of the atoms are employed for C as long as the total number thereof coordinates stoichiometrically with the above-described formula.

D represents a metal atom belonging to Group 5A of the periodic table, and includes vanadium, niobium and tantalum. Two or more kinds of the atoms belonging to Group 5A of the periodic table are employed for D as long as the total number thereof coordinates stoichiometrically with the above-described formula.

E represents a metal atom belonging to Group 4 of the periodic table and includes, for example, silicon, germanium, tin, lead, titanium and zirconium. Two or more kinds of the atoms belonging to Group 4 of the periodic table are employed for E as long as the total number thereof coordinates stoichiometrically with the above-described formula.

x represents a number of from 0 to 2.

Specific examples of the compound represented by formula $AB_{2-x}C_xD_{3-x}E_xO_{10}$ include $CsLa_2NbTi_2O_{10}$, $HCa_{1.5}La_{0.5}Nb_{2.5}Ti_{0.5}O_{10}$ and $LaNbTi_2O_{10}$.

The compounds represented by formula $AB_{2-x}C_xD_{3-x}E_xO_{10}$ can be produced in a known manner. For instance, fine particles of $CsLa_2NbTi_2O_{10}$ are obtained by finely pulverizing $Cs_2CO_3$, $La_2O_3$, $NbO_5$ and $TiO_2$ in an amount stoichiometrically coordinating with the above formula in a mortar, baking at 130° C. for 5 hours in a platinum crucible, cooling and pulverizing in a mortar to obtain fine particles of several microns or less. This method is not particularly limited to the production of $CsLa_2NbTi_2O_{10}$ type particles and applied to the production of other particles of $AB_{2-x}C_xD_{3-x}E_{10}$ including $HCa_{1.5}La_{0.5}Nb_{2.5}Ti_{0.5}O_{10}$ and $LaNbTi_2O_{10}$.

The metallic compound having photo-catalytic property which is commercially available is also employed.

In the present invention, the metallic compounds having photo-catalytic property including $TiO_2$, $RTiO_3$, $AB_{2-x}C_xD_{3-x}E_xO_{10}$, $SnO_2$, $ZrO_2$, ZnO, ZnS, CdS, PbS, SiC, $WO_3$, CdSe, $MOS_2$, $MoSe_2$, $Bi_2O_3$ and $Fe_2O_3$ are used individually or in a combination of two or more thereof as a thin layer provided directly or through other constituting layer on a support.

In order to provide the photo-catalytic metallic compound for use in the present invention on a support, various known methods, for example, (1) a method of coating a dispersion of fine particles of the metallic compound on a support, (2) a method of reducing or removing a binder by baking the layer formed by the method (1) described above, (3) a method of forming a thin layer of the metallic compound by various vacuum thin film-forming methods on a support, (4) a method of coating an organic compound such as an alcoholate of the metal element on a support, subjecting to hydrolysis and then oxidizing the layer by baking to form a thin metal film having an appropriate thickness, and (5) a method of spraying under heating an aqueous solution of a salt, for example, hydrochloride or nitrate containing the metal can be appropriately employed.

The above method (1) or (2) for coating fine barium titanate particles includes a method of coating a mixed dispersion of barium titanate and silicon to form a layer and a method of coating a mixture of barium titanate and an organopolysiloxane or a monomer thereof to form a layer.

Also, the metallic compound may be dispersed in a polymer binder capable of coexisting with the metallic compound to form the metallic compound layer. As the polymer binder for the fine metallic compound particles, a polymer capable of dispersing fine barium titanate particles is widely used. Preferred examples of the polymer binder include a hydrophobic binder such as a polyalkylene polymer, e.g., polyethylene, polybutadiene, polyacrylate, polymethacrylate, polyvinyl acetate, polyvinyl formate, polyethylene terephthalate, polyethylene naphthalate, polyvinyl alcohol, partially saponified polyvinyl alcohol and polystyrene. These polymer binders may be used in combination.

This method can be also applied to form a thin layer using magnesium titanate, calcium titanate, strontium titanate, an intermolecular compound thereof and a mixture thereof, in addition to barium titanate.

Using coating methods (1) and (2), it is also possible to coat fine particles of $CsLa_2NbTi_2O_{10}$. Specifically, $Cs_2CO_3$, $La_2O_3$, $NbO_5$ and $TiO_2$, which are stoichiometrically corresponding to $CsLa_2NbTi_2O_{10}$, are finely pulverized in a mortar, the content is put in a platinum crucible and baked at 130° C. for 5 hours, then cooled and put again in a mortar and pulverized to obtain fine particles of several micrometers or less. The resulting fine particles of $CsLa_2NbTi_2O_{10}$ are dispersed in a binder in the same manner as the barium titanate described above, followed by coating to form a thin film. This method is not limited to the production of fine particles of $CsLa_2NbTi_2O_{10}$ and can be applied to the production of $AB_{2-x}C_xD_{3-x}E_xO_{10}$ including $HCa_{1.5}La_{0.5}Nb_{2.5}Ti_{0.5}O_{10}$ and $LaNbTi_2O_{10}$.

The above method (3) of forming the photo-catalytic metallic compound layer using a vacuum thin film-forming method generally includes a sputtering or vacuum thin film-forming method. In the sputtering method, a simple substance or binary compound target is previously prepared. For instance, a thin barium titanate crystalline film can be obtained by performing RF sputtering using a barium titanate target in an argon/oxygen mixed atmosphere with maintaining a temperature of a substrate for a deposit film at 450° C. or higher. In order to control the crystallinity, post-annealing may be performed at 300 to 900° C., if desired. This method can be applied to $RTiO_3$ (wherein R represents an alkaline earth metal atom) and other photo-catalytic metallic compounds and similar thin films can be formed by adjusting the temperature of the substrate optimally for crystal control.

For example, a thin film of tin oxide which meets the object of the present invention can be obtained by RF sputtering with a sputtering power of 200 W in the argon/oxygen (50/50 by mol) mixed atmosphere at a substrate temperature of 120° C.

The above method (4) of using a metal alcoholate is also a method capable of forming the desired thin film without using a binder. A thin film of a barium titanate can be formed by coating a mixed alcohol solution of barium ethoxide and titanium butoxide on a silicon substrate having $SiO_2$ on the surface thereof, subjecting hydrolysis the coated surface and then heating at 200° C. or higher. This method can be applied to the formation of a thin film of the above-described other metallic compounds including $RTiO_3$ (wherein R represents an alkaline earth metal atom), $AB_{2-x}C_xD_{3-x}E_xO_{10}$ (wherein A, B, C, D and E each has the same meaning as defined above), $SnO_2$, $Bi_2O_3$, and $Fe_2O_3$.

The above method (5) of forming a thin photo-catalytic metallic compound film is also a method capable of forming the desired thin film without using a binder. A thin $SnO_2$ film can be formed by spraying an aqueous hydrochloric acid solution containing $SnCl_4$ on a surface of quartz or crystalline glass heated at 200° C. or higher. This method can be applied to the formation of a thin film of the above-described other metallic compounds including $RTiO_3$ (wherein R represents an alkaline earth metal atom), $AB_{2-x}C_xD_{3-x}E_xO_{10}$ (wherein A, B, C, D and E each has the same meaning as defined above), $Bi_2O_3$ and $Fe_2O_3$, in addition to $SnO_2$.

A volume ratio of the metallic compound in the thin photo-catalytic metallic compound layer is from 75 to 100%, preferably from 85 to 95%. The metallic compounds may contain inevitable impurities.

In any of the above cases, a thickness of the thin metallic compound film is from 1 to 100,000 Å, preferably from 10 to 10,000 Å. More preferably, it is 3,000 Å or less for preventing distortion due to light interference, and 50 Å or more for exhibiting light activity function sufficiently.

Light-heat Convertible Minute Particles

The light-heat convertible minute particles for use in the present invention include, for example, minute metal particles, pigment(dye), metallic compound powder and metal powder, and carbon black as described below. I. Light-heat convertible minute metal particles:

<Materials for Forming Light-heat Convertible Minute Metal Particles>

The minute metal particles which are preferably used include minute particles of Ti, V, Cr, Mn, Fe, Co, Ni, Cu, Zn, Y, Zr, Mo, Ag, Au, Pt, Pd, Rh, In, Sn, W, Re, Sb, Te, Ge and Pb.

Of the metal constituting the minute metal particles, metal which has an absorption in a visible or infrared region, for example, Re, Sb, Te, Au, Ag, Cu, Ge, Pb or Ge is more preferred.

Also, metal which constitutes a metallic compound capable of easily promoting photo-catalytic reduction and which has an ionization tendency smaller (nobler) than a hydrogen atom, for example, Ag, Au, Cu, Pt, Pd or Rh is particularly preferred. Most preferred elements are Ag, Au and Cu.

A covering rate of the light-heat convertible minute metal particles born on the surface of the metallic compound layer having photo-catalytic property is appropriately selected in a range sufficient for revealing heat mode light response and converting the hydrophilicity of the metallic compound layer to hydrophobicity upon irradiation with an active ray. If the covering rate is too low, conversion of the metallic compound layer from hydrophilicity to hydrophobicity is not sufficiently occurred upon the imagewise irradiation, and thus the hydrophobicity in the irradiated region becomes insufficient. On the other hand, when it is too high, energy necessary for the imagewise irradiation becomes disadvantageously large. In general, the covering rate is preferably from 0.01 to 10%, more preferably from 0.05 to 5%.

In order to control the covering rate, factors such as concentration of the water-soluble metal salt and composition of other components in the aqueous solution, and time and temperature of the reducing reaction are appropriately selected. The covering rate for use in the present invention is determined by observation of a photograph on the surface of the metallic compound layer. The photograph on the surface of the metallic compound layer can be obtained using an optical microscope, an electron microscope, and particularly a reflection optical microscope.

A method for forming and bearing the minute metal particles on the photo-catalytic metallic compound layer preferably includes the following four methods, but the present invention should not be construed as being limited thereto.

(1) Photo-catalytic reduction method of water-soluble metallic compound, (2) Vacuum deposition or spattering method of minute metal particles, (3) Electroless reduction deposition method of metallic compound, and (4) Method of immersion in or coating of dispersion of minute metal particles.

These methods are described in detail below.

(1) Photo-catalytic Reduction Method of Water-soluble Metallic Compound

<Water-soluble Metal Salt>

The minute metal particles which are preferred as the light-heat convertible minute particles described above can be obtained by reduction deposition of minute metal particles on the surface of the photo-catalytic metallic compound layer using a water-soluble metal salt containing metal constituting the minute metal particles.

While the reduction deposition method can be performed by means of a chemical reaction of the water-soluble metal salt described above with a material which is subjected to oxidation as described hereinafter, it is particularly preferred to conduct the reduction deposition by irradiation with an active ray utilizing a photo-catalytic function of the photo-catalytic metallic compound.

Specifically, when the metallic compound layer having photo-catalytic property is irradiated with an active ray in the presence of the water-soluble metal salt, the water-soluble salt is subjected to photo-reduction and deposited in the form of minute particles on the surfaces of the metallic compound layer having photo-catalytic property. Thus, the metallic compound layer which has a photo-catalytic property and a hydrophilic surface and bears the light-heat convertible minute particles on the surface thereof according to the present invention can be prepared in an extremely simple manner.

The water-soluble metal salt which is used for forming the minute metal particles includes a nitrate, sulfate, halogenide, halide, halogenide complex salt, ammonia complex salt (an ammoniac aqueous solution of each of the above-described salts) and sulfite. Also, a metal salt such as silver complex salt of amine or ammonia, silver salt of carboxylic acid or silver salt of organic sulfur compound can be used. Specific examples thereof include silver ammine complex nitrate, silver acetate, silver lactate, silver benzoate, silver 2-mercaptobenzimidazole, silver 5-methyl-1,3,4-thiadiazol-2-thiol and silver 1-phenyl-1H-tetrazole.

In order to bear the minute metal particles on the surface of the thin metallic compound layer having photo-catalytic property, the thin metallic compound layer having photo-catalytic property are subjected to irradiation with an active ray in the presence of a water-soluble metal salt containing metal constituting the minute metal particles. The term "in the presence of a water-soluble metal salt" means and includes a method in which the thin metallic compound layer is immersed in the aqueous solution of the metal salt, a method in which the aqueous solution of the metal salt is coated on the thin metallic compound layer, and appropriate other methods for contacting the metal salt with the thin metallic compound layer. In the aqueous solution of the metal salt, a material which is subjected to oxidation as described hereinafter is preferably incorporated.

A concentration of the metal salt in the aqueous solution of the metal salt used is ordinarily from 0.0001 to 10 mol/liter, preferably from 0.001 to 5 mol/liter, and more preferably from 0.01 to 3 mol/liter.

<Material Which is Subjected to Oxidation for Promoting the Formation of Minute Metal Particles>

As the material which is subjected to oxidation, a wide variety of materials can be used as far as they can undergo a reaction with a precursor of the light-heat convertible minute metal particles such as the water-soluble metal salt described above to promote the deposition of reduced products, i.e., the light-heat convertible minute metal particles on the surface of the photo-catalytic metallic compound layer. In such a reaction, it is believed that the material which is subjected to oxidation is oxidized to decompose itself and thereby decreasing in quantity or becoming extinct. The material which is subjected to oxidation is also called a reducing material hereinafter. Suitable examples of the reducing material include a high molecular weight compound and a low molecular weight compound (including an oligomer) each having a hydroxyl group, a carboxyl group, an amino group, an amido group, a sulfonamido group, a formyl group, a carbonyl group, an ester linkage, an ether linkage, a urethane linkage or a urea linkage.

The low molecular weight reducing materials are described below.

Examples of the low molecular weight reducing material which can be used for the purpose of the present invention include saccharides and carbohydrates such as malt sugar, milk sugar, dextran, dextrin and soluble starch (although these compounds include high molecular weight compounds, compounds converted by hydrolysis so as to have a low molecular weight are also included therein, so that they are described herein for convenience of explanation); aldehydes such as formaldehyde, acetoaldehyde, glyoxal, succinic dialdehyde, butyl aldehyde, 3-hydroxy-2-methylpentanal, 3-formyl-2-hydroxypropionic acid, terephthalaldehyde and p-hydroxybenzaldehyde; alcohols or phenols having a hydroxy group such as sorbitol, cylcohexanol, n-decyl alcohol, glycerol, erythritol, benzyl alcohol, 4-methoxyphenol and hydroquinone; compounds having a carboxy group such as lauric acid, β-chloropropionic acid, benzoic acid, salicylic acid, adipic acid, succinic acid, glycine and phthalic acid; ethers such as ethylene glycol dimethyl ether; amides such as acetylurea, ethyleneurea, m-nitrobenzamide, salicylanilide, terephthalic acid amide, p-toluenesulfonamide and N-methylpyrrolidone; esters such as diphenyl carbonate, ethyl p-hydroxybenzoate, ethyl p-nitrobenzoate, n-butyl carbamate and ethylene glycol monoethyl ether monoacetate; amines such as laurylamine, p-chloroaniline, p-hydroxyphenylamine, diphenylamine and p-aminosalicylic acid; and ketones such as acetylacetone, acetophenone, benzophenone and dibenzoylmethane.

When such a compound is used, while the amount thereof may be varied depending on the kind thereof, it is ordinarily from 1 to 1,000 mol %, preferably from 10 to 500 mol %, of the solid weight of the water-soluble metal salt.

In the present invention, the deposition of minute metal particles upon imagewise irradiation with an active ray is promoted by the reducing material, as described above. The reducing material used is either the low molecular weight compound or oligomer compound described above, or a reducing high molecular weight compound described below. Also, a mixture of these low and high molecular weight compounds may be used.

Preferred hydrophilic high molecular weight reducing materials which can be used for the purpose of promoting the deposition of the minute metal particles include specifically a water-soluble resin, for example, polyvinyl alcohol (PVA), modified polyvinyl alcohol such as carboxyl-modified polyvinyl alcohol, starch and a derivative thereof, a cellulose derivative such as carboxymethyl cellulose and hydroxyethyl cellulose, casein, gelatin, polyvinyl pyrrolidone, a vinyl acetate-crotonic acid copolymer, a styrene-maleic acid copolymer, a alginic acid and an alkali metal salt, alkaline earth metal salt or ammonium salt thereof, polyacrylic acid and a salt thereof, polyethyleneoxide, a water-soluble urethane resin, a water-soluble polyester resin, polyhydroxyethyl acrylate, a polyethylene glycol diacrylate polymer and an N-vinylcarboxylicamide polymer.

Further, a water-insoluble high molecular weight compound can be used in the form of an aqueous emulsion. The aqueous emulsion is an aqueous solution of a hydrophobic polymer suspended therein comprising fine polymer particles and, if desired, a protective agent for stabilizing the dispersion of the fine polymer particles dispersed in water.

Specific examples of the aqueous emulsion for use in the present invention include a vinyl-series polymer latex (e.g., a polyacrylate-series, vinyl acetate-series or ethylene-vinyl acetate-series latex), a conjugated diene-series polymer latex (e.g., a methyl methacrylate-butadiene-series, styrene-butadiene-series, acrylonitrile-butadiene-series or chloroprene-series) and a polyurethane resin.

<Formation of Minute Metal Particles Upon Photo-catalytic Reduction>

An active ray means a ray having a wavelength which is absorbed by the metallic compound having photo-catalytic property and activates it to generate the catalytic function. A light source for the active ray is appropriately selected from a mercury lamp such as a high-pressure mercury lamp, a xenon arc lamp, a xenon discharge lamp, various fluorescent lamps, a tungsten halogen lamp and a laser beam having an oscillation wavelength in a visible region or ultraviolet region depending on a method of plate-making or the kind of the metallic compound having photo-catalytic property.

In order to control the covering rate, factors such as concentration of the water-soluble metal salt and composition of other components in the aqueous solution, and time and temperature of the reducing reaction are appropriately selected. The concentration of the metal salt and the irradiation intensity and time of an active light are appropriately selected so as to reach the covering rate as described above. The amount of light exposure is from 0.01 to 20 CMS, preferably from 0.1 to 10 CMS, and reciprocity law failure is negligible.

(2) Vacuum Deposition or Spattering Method of Minute Metal Particles

In case of using metal which has high ionization tendency and is hardly subjected to photo-catalytic reduction for the light-heat convertible minute metal particles, the metal can be deposited on the photo-catalytic metallic compound layer by vacuum deposition or spattering method.

In order to conduct the vacuum deposition or spattering method for the purpose of depositing the minute metal particles, the method as described in the formation of photo-catalytic metallic compound layer above can be utilized. Depending on a vapor pressure of the metal to be vacuum deposited or spattered and facility of the formation of oxygen compound, a degree of vacuum, a partial pressure of oxygen and a temperature are appropriately selected. These conditions are different from those for the formation of thin photo-catalytic metallic compound layer described above.

Further, the metal vacuum deposited or spattered should form isolated insular minute particles and thus, the vacuum deposition or spattering process must be stopped before the formation of a continuous thin layer.

Preferred examples of the metal suitable for use in the method include V, Cr, Mn, Y, Zr, Mo, Pt, Pd, Rh, In, W and Ge.

(3) Electroless Reduction Deposition Method of Metallic Compound

The formation of minute metal particles can be conducted by a non-catalytic chemical reaction of a metal salt which is reduced capable of forming a precursor of the minute metal particles with a reducing material without irradiation with an active ray to deposit reductively. In such a case, in order to perform the reductive deposition without a catalysis, it is effective to conduct the reaction at a high pH.

<Metal Salt Which is Subjected to Reduction>

The metal salt which is subjected to reduction is also called an oxidizing metal salt hereinafter. The oxidizing metal salt which can be applied to the present invention is described below.

Since the property which is subjected to reduction of metal salt can be determined by adjustment of electroless reduction condition, a usable metallic salt can be selected from a range broader than in the case of depositing the minute metal particles by utilizing the photo-catalytic property as described above. A preferred metal salt is a water-soluble metal salt wherein a constituent metallic element has an ionization tendency smaller (nobler) than a chromium element. Such a metallic element includes Cr, Co, Ni, Sn, Ti, Pb, Fe(III), Cu, Mo, W, Ph, Ir, Pd, Hg, Ag, Pt and Au.

Of the metallic elements constituting the metal salt, Ag, Cu, Fe, Ni, Pb, Pd, Au, Pt, W, Ti, Co and Cr are preferred and Ag, Cu, Fe, Au and Cr are more preferred.

A counter salt of the metallic element of the metal salt may be any form of salt as long as it is water-soluble, and selected, for example, from an inorganic salt such as nitrate, sulfate, chloride and thiocyanate, an ammine complex salt such as silver ammonium complex nitrate and copper ammonium complex nitrate, and a polyhalo complex salt of silver or gold such as polychloro silver complex ion.

<Reducing Agent for Electroless Reduction>

A reducing agent to be used in combination with an oxidizing metal salt is described below.

As described above, the condition of the reducing agent is that the oxidation potential of the reducing agent is baser than the reduction potential of the metal salt combined in the system of the aqueous solution, which practically means that the maximum potential of an oxidation wave of the reducing agent is on the negative side (base side) than the maximum potential of an reduction wave of the metal salt. More preferably, the reduction potential of the metal salt is nobler than the oxidation potential of the reducing agent by 20 mV or more.

As a practical standard, a reducing compound having the maximum potential of the oxidation wave of from +100 to −700 mV (SCE) is preferred. Since a hydrogen ion (or a hydroxide ion) is concerned in many oxidation/reduction reactions, the maximum potential of the oxidation wave in cyclic voltammetry of the reducing compound is largely fluctuated by pH. Accordingly, a condition capable of precipitation and a suitable precipitation rate can be selected by the control of pH. For instance, when the metal salt is the above-described gold, silver or copper compound, the suitable maximum oxidation potential of the reducing agent is in a range of from +100 to −700mV (SCE) in the system of the aqueous solution. A preferred reducing agent exhibiting the maximum oxidation potential falling within the above-described range in the system of an alkaline aqueous solution will be described in more detail below.

Specific examples of the reducing agent are shown below.

1) Saccharide and Carbohydrate

A saccharide and carbohydrate including a starche which is polymerized form of a saccharide is used in the present invention as a preferred reducing agent. Although a reducing property of saccharide and carbohydrate is believed to be weak, they have the reducing property sufficient for reducing the above-described oxidizing metal salt under an alkaline condition. In addition, they can be used in a high concentration and the reduction reaction proceeds uniformly, therefore, even precise patterns can be formed with accuracy.

Preferred specific examples thereof are described below.

Specific examples of monosaccharide for use in the present invention include, for example, glyceraldehyde, dihydroxy-acetone (including a dimer), erythrose, threose, ribose, arabinose, xylose, lyxose, xylulose, ribulose, deoxy-D-ribose, allose, altrose, glucose, mannose, gulose, idose, galactose, talose, quinovose, digitalose, digitoxose, cymarose, sorbose, tagatose, fucose, 2-deoxy-D-glucose, psicose, fructose, rhamnose, D-glucosamine, D-galactosamine, D-mannosarmine, D-glycero-D-galactoheptose, D-glycero-D/L-mannoheptose, D-glycero-D-gloheptose, D-glycero-D-idoheptose, D-glycero-L-glucoheptose, D-glycero-L-taloheptose, altroheptulose, mannoheptulose, altro-3-heptulose, glucuronic acid, N-acetyl-D-glucosamine, glycerol, threitol, erythritol, arabitol, adonite, xylitol, sorbitol, mannitol, iditol, talitol, dulcitol, and allodulcitol.

Of these compounds, xylose, glucose, mannose, galactose, sorbose, D-glycero-D/L-mannoheptose, glycerol, sorbitol and mannitol are particularly preferably used.

Specific examples of polysaccharide for use in the present invention include, for example, maltose, cerbiose, trehalose, gentiobiose, isomaltose, lactose, raffinose, gentianose, stachyose, xylan, araban, glycogen, dextran, inulin, levan, galactan, agarose, amylose, sucrose, agarobiose, α-dextrin, β-dextrin, γ-dextrin, δ-dextrin, ε-dextrin, soluble starch, and thin paste starch. Also, derivatives of polysaccharides, for example, methyl cellulose, dimethyl cellulose, trimethyl cellulose, ethyl cellulose, diethyl cellulose, triethyl cellulose, carboxymethyl cellulose, carboxyethyl cellulose, aminoethyl cellulose, hydroxymethyl cellulose, hydroxyethylmethyl cellulose, hydroxypropyl cellulose, hydroxypropylmethyl cellulose, hydroxypropylmethyl cellulose acetate succinate, and carboxymethylhydroxyethyl cellulose can be used.

Of these compounds, maltose, lactose, dextran, inulin, amylose, sucrose, α-dextrin, β-dextrin, γ-dextrin, soluble starch, methyl cellulose, ethyl cellulose, carboxymethyl cellulose, carboxyethyl cellulose, hydroxymethyl cellulose, hydroxyethylmethyl cellulose, hydroxypropyl cellulose, hydroxypropylmethyl cellulose, hydroxypropylmethyl cellulose acetate succinate, and carboxymethylhydroxyethyl cellulose are particularly preferably used.

Saccharides exist widely and naturally and are easily commercially available. Also, various derivatives thereof can be easily synthesized by a reduction, oxidation or dehydration reaction.

When the saccharide is used as a reducing agent, a pH of the aqueous solution for electroless reduction for depositing minute metal particles is preferably 8 or more, more preferably 10 or more, and particularly preferably 12 or more. The upper limit may be the region where the pH has no substantial means, i.e., 14 or more, or where a concentration of alkali hydroxide may be 10%.

An amount of the saccharide added to the aqueous solution for electroless reduction is ordinarily from 0.1 to 30 wt %, preferably from 0.5 to 15 wt %. It is preferred that the total amount thereof is stoichiometrically larger than the amount of the metal salt when the metal salt is coexistent in the aqueous solution and when the metal salt is incorporated into the image recording material. Advantageously, the amount thereof is ordinarily from 1.0 to 10 equivalent weight, preferably from 1.01 to 5 equivalent weight, based on the metal salt. The optimal range fluctuates according to the existence of a metallic compound and a complex-forming agent.

2) Aldehyde

As can be understood from the example of Fehling's solution, an aldehyde can be used in the present invention as the reducing agent. Specific examples of the aldehyde which can be preferably used in the present invention include an aliphatic saturated aldehyde such as formaldehyde, glutaraldehyde, acetaldehyde, propionaldehyde and butyraldehyde, an aliphatic dialdehyde such as glyoxal and succindialdehyde, an unsaturated aldehyde such as acrolein, crotonaldehyde and propiolaldehyde, an aromatic aldehyde such as benzaldehyde and salicylaldehyde, and a heterocyclic aldehyde such as furfural, and also, a sucrose having an aldehyde group or a ketone group, a monosaccharide such as glucose, fructose, an oligosaccharide, a substituted monosaccharide such as deoxysugar, methylglycose, thiosugar and amino sugar.

An amount of the aldehyde compound added to the aqueous solution for electroless reduction is ordinarily from 0.02 to 5.0 mol, preferably from 0.1 to 2.0 mol, per liter of the aqueous solution. The aldehyde is preferably used under an alkaline condition, and a pH of the solution is from 7 to 14, preferably from 9 to 12.

3) Photographic Developing Agent

The following compounds which are known as photographic developing agents are also preferably used as the reducing agent for electroless reduction, e.g., a hydroquinone such as hydroquinone and monochlorohydroquinone, a catechol such as catechol and pyrocatechol, a p-aminophenol such as p-aminophenol and N-methyl-p-aminophenol, a p-phenylenediamine such as p-phenylenediamine, 2-methyl-p-phenylenediamine and diethyl-p-phenylenediamine, o-phenylenediamine, a 3-pyrazolidone such as 1-phenyl-3-pyrazolidones, a 3-aminopyrazole, a 4-aminopyrazolone, a 5-aminouracil, a 4,5-dihydroxy-6-aminopyridine, a leductone such as ascorbic acid, erysorbic acid and leductonic acid, an o- or p-sulfonamidonaphthol, an o- or p-sulfonamidophenol, a 2,4-disulfonamidophenol, a resorcin such as resorcin and diaminoresorcin, a 2,4-disulfonamidonaphthol, an o- or p-acylaminophenol, a 2-sulfonamidoindanone, a 4-sulfonamido-5-pyrazolone, a 3-sulfonamidoindole, a sulfonamidopyrazolobenzimidazole, a sulfonamidopyrazolobenztriazole, a sulfonamide ketone, and a hydrazine such as arylhydrazine, phenylhydrazine and hydrazobenzene.

Particularly, the leductone is preferred since its oxidant does not adversely influence. Particularly preferred leductone includes ascorbic acid, erysorbic acid, glucoleductone and leductonic acid.

An amount of the developing agent added to the aqueous solution for electroless reduction is ordinarily from 0.005 to 1.0 mol, preferably from 0.05 to 0.5 mol, per liter of the aqueous solution. When the developing agent is used as the reducing agent, it is also preferably used under an alkaline condition, and a pH of the solution is preferably lower than that in the developing condition of photographic light-sensitive material, e.g., from 5 to 12, preferably from 7 to 9.

<Method of Bearing Minute Metal Particles>

For the surface of the metallic compound to carry minute metal particles, the aqueous solution for electroless reduction containing a reducing agent is applied to the surface of the metallic compound in the presence of a metal salt corresponding to the minute metal particle (i.e., a precursor of the minute metal particle). Specifically, any of the following methods, for example, a method in which a metal salt and a reducing agent are added to the aqueous solution for electroless reduction, and a hydrophilic image recording layer containing metallic compound particles dispersed therein is immersed in or impregnated with the[]aqueous solution to deposit the minute metal particles on the surfaces of the metal compound particles, a method in which a hydrophilic image recording layer containing a metallic salt together with the metallic compound particles is immersed in or impregnated with the aqueous solution for electroless reduction containing a reducing agent to deposit the minute metal particles on the surfaces of the metallic compound particles, and a method in which the metallic compound particles are suspended in the aqueous solution for electroless reduction containing a reducing agent to deposit the minute metal particles on the surfaces of the metallic compound particles in advance, and a composition containing the metallic compound particles is coated to form an image recording layer can be used When the aqueous solution of a metal salt is used, a concentration of the metal salt in the aqueous solution is ordinarily from 0.0001 to 10 mol/liter, preferably from 0.001 to 5 mol/liter, and more preferably from 0.01 to 2 mol/liter. When the metal salt is impregnated or added to the image recording layer, the metal salt is impregnated or added so that a concentration of the metal salt in the reduction reaction atmosphere of the deposition of the minute metal particles becomes from 0.0001 to 10 mol/liter, preferably from 0.001 to 5 mol/liter, and more preferably from 0.01 to 2 mol/liter.

(4) Method of Immersion in or Coating of Dispersion of Minute Metal Particles

The dispersion of minute metal particles can be prepared using a surface active agent for dispersion such as naphthalenetamol or a protective colloid such as gelatin. A concentration of the minute metal particles may be appropriately selected so as to reach the covering rate on the photo-catalytic metallic compound layer as described above. The concentration thereof is ordinarily in a range of from 1 to 10% by weight.

II. Pigment

A pigment can also be preferably used as the light-heat convertible minute particles born on the surface of the photo-catalytic metallic compound layer. The pigment which can be used in the present invention includes the following pigments.

(1) Inorganic Pigment

Chrome yellow, cadmium yellow, nickel titanium yellow, iron oxide red, cadmium red, molybdenum red, ultramarine, cobalt blue, emerald green, etc.

(2) Organic Metal Complex Pigment

A phthalocyanine complex compound of copper, chromium, cobalt, manganese, etc.

Since these pigments in items (1) and (2) are sufficiently heat-resistive, they act to convert the property of the photo-catalytic metallic compound layer without heat abrasion of the pigments per se, even if the temperature is increased in the heat mode image formation. Further, since these pigments have broad absorption spectrum regions, a radiant ray is not necessary to be an infrared ray. For example, they have such an advantage that they can easily effect local heating of 100° C. or higher by irradiation with a xenon flash light of continuous spectrum having a luminous maximum at 500 to 600 nm with a high illumination intensity and a short time in combination with a high capacity condenser.

(3) Organic Pigment

Triphenylmethane-based, quinacridone-based, perylene-based, isoindolinone-based, dioxazine-based, quinophthalone-based, monoazo-based and disazo-based pigments are heat-resistive, have a high absorption coefficient and are excellent light-heat convertible materials. Specific examples thereof include Chromophthal Scarlet R, Perylene Red 178, Benzimidazolone Carmine HF4C, Lake Red C, Rhodamine 6G Lake, Permanent Red FGR, Permanent Bordeaux FGR, Quinacridone Magenta 122, and Yellow H10GL.

In addition, commercially available pigments, and pigments described in *Color Index* (*C.I.*) *Handbook, Saishin Ganryo Binran* (*The Latest Pigment Handbook*), edited by Nippon Ganryo Gijutsu Kyokai (1977), *Saishin Ganryo Oyo Gilutsu* (*Application Techniques of the Latest Pigment*), CMC Publishing Co. (1986), and *Insatsu Ink Gijutsu* (*Techniques of Printing Ink*), CMC Publishing Co. (1984) can be used in the present invention.

A particle size of the pigment is preferably from 0.01 to 10 μm, more preferably from 0.05 to 1 μm, and particularly preferably from 0.1 to 1 μm. When the particle size of pigment is less than 0.01 μm, the dispersion stability of pigment in a coating solution for the image is inferior. On the other hand, when it exceeds 10 μm, uniformity of thermal distribution may become poor.

Well-known dispersing methods used in the production of ink and toner can be used for dispersing the pigment. A dispersing machine such as an ultrasonic disperser, a sand mill, an attriter, a pearl mill, a super mill, a ball mill, an impeller, a disperser, a KD mill, a colloid mill, Dynatron, a three-roll mill and a pressure kneader can be used for dispersion. Details of these are described in *Saishin Ganryo Oyo Gijutsu* (*Application Techniques of the Latest Pigment*), CMC Publishing Co. (1986).

Each organic pigment described in item (3) also has an absorption in the visible region and functions as the light-heat convertible material either with an infrared ray or a visible ray with high intensity of illumination same as the pigments in (1) and (2).

(4) Minute Particles of Light-heat Convertible Dye

Well-known commercially available dyes and dyes described in literature (e.g., *Senryo Binran* (*Dye Handbook*), edited by Yuki Gosei Kagaku Kyokai (1970)) can be used as the light-heat convertible material in the present invention. Specifically, an azo dye, a metal complex salt azo dye, a pyrazolone azo dye, an anthraquinone dye, a phthalocyanine dye, a carbonium dye, a quinonimine dye, a methine dye, a cyanine dye and a metal thiolate complex can be used as the light-heat convertible material.

Preferred examples of the dye include, for example, cyanine dyes described in JP-A-58-125246, JP-A-59-84356, JP-A-59-202829, and JP-A-60-78787; methine dyes described in JP-A-58-173696, JP-A-58-181690, and JP-A-58-194595; naphthoquinone dyes described in JP-A-58-112793, JP-A-58-224793, JP-A-59-48187, JP-A-59-73996, JP-A-60-52940, and JP-A-60-63744; squarylium dyes described in JP-A-58-112792; cyanine dyes described in British Pat. No. 434,875; near infrared absorbing sensitizers described in U.S. Pat. No. 5,156,938; substituted arylbenzo (thio)pyrylium salts described in U.S. Pat. No. 3,881,924; and trimethine thiapyrylium salts described in JP-A-57-142645 (corresponding to U.S. Pat. No. 4,327,169).

Of these dyes, those particularly preferred are cyanine dyes, squarylium dyes, pyrylium salts and nickel thiolate complexes.

The dye is dissolved in an appropriate solvent to form a solution or it is dispersed in an appropriate dispersing medium to form a dispersion, and the photo-catalytic metallic compound layer is subjected to immersion treatment in the solution or dispersion, whereby the dye is born on the surface of the photo-catalytic metallic compound layer.

III. Metallic Compound Powder and Metal Powder

A silver colloid dispersion in which silver particles have an average particle size of from 5 to 150 nm is less dependent upon a radiant ray because the dispersion has a high absorption coefficient to any radiant ray having a wavelength of from a visible ray region to an infrared ray region. On the other hand, silicon, germanium, a germanium-arsenic compound and an indium-phosphorus compound have a high light-heat conversion function to an infrared ray, and absorption wavelength ends thereof are 1,150, 1,800, 1,800 and 1830 nm, respectively. Specifically, they have the light-heat conversion function to a radiant ray shorter than these absorption wavelength ends, respectively.

Further, powder of ITO (indium oxide doped with tin), chromium oxide and oxides of transition metal elements can be employed as the light-heat convertible minute particles. Such powder are dispersed using a surface active agent such as naphthalenetamol as a dispersing aid to form a dispersion, and the photo-catalytic metallic compound layer is subjected to immersion treatment in the dispersion, whereby the powder are born on the surface of the photo-catalytic metallic compound layer.

IV. Others

Carbon black is well known as an excellent light-heat convertible material which is not dependent upon a radiation spectrum as well as silver colloid fine particles. Since carbon black is hydrophobic, it is preferred to treat to render its surface hydrophilic for increasing dispersibility in a binder resin. Any appropriate conventionally known methods can be used for rendering the surface hydrophilic. For instance, the surface of carbon black particles is rendered hydrophilic by subjecting to treatment for introducing a hydroxy group or silicate treatment. More specifically, 10 g of carbon black particles previously dried are degassed at a reduced pressure of not more than $10^{-2}$ Torr in a reaction vessel and irradiated with plasma at a power of 20 W for one hour under stream of steam with rotating the reaction vessel to obtain hydroxy group-introduced carbon black. Although the carbon black is rendered hydrophilic at this stage, a further procedure is conducted in order to increase hydrophilicity. Specifically, 1.5 g of the resulting hydroxy group-introduced carbon black is dispersed in 40 ml of water and to the dispersion was dropwise added 3 ml of tetraethoxysilane followed by reacting for a time of from 2 to 6 hours at a room temperature. As the reaction time is longer, the surface hydrophilicity increases. Hydrochloric acid or ammonia may be added as a catalyst. After the completion of the reaction, the reaction product is washed with water and dried to obtain surface silicate-treated carbon black. It is believed that during the above-described procedure for the preparation of surface silicate-treated carbon black, tetraethoxysilane is reacted with a hydroxy group of the hydroxy group-introduced carbon black to bond with releasing an alcohol and further the remaining ethoxy group is hydrolyzed to form the surface silicate-treated carbon black. Further, the surface of an image recording layer containing carbon black may be subjected to treatment for rendering hydrophilic such as silicate treatment by the method as described with respect to the image recording layer containing minute metal particles.

Silica particles are also preferably used as the light-heat convertible material. Further, carbon graphite, iron sulfide and chromium sulfide are used as the light-heat convertible material.

These light-heat convertible materials including carbon black can be born on the surface of the photo-catalytic metallic compound layer by the method described above.

Support

A support to which the photo-catalytic metallic compound layer is applied is described below.

The support which can be used in the present invention is a plate-like material having dimensional stability, and examples of the support include paper, paper laminated with plastics (e.g., polyethylene, polypropylene or polystyrene), a metal plate (e.g., aluminum, zinc, copper or stainless steel), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal), and paper or a plastic film laminated or deposited with the above-described metal.

A preferred support includes a polyester film, an aluminum plate and an SUS plate not liable to be corrosive as a printing plate. Of these materials, an aluminum plate is particularly preferred because it is dimensionally stable and relatively inexpensive.

A preferred aluminum plate includes a pure aluminum plate and an aluminum alloy plate comprising aluminum as a main component and a trace amount of different element. A plastic film laminated or deposited with aluminum may also be used. The different element which may be contained in the aluminum alloy is, for example, silicon, iron, manganese, copper, magnesium, chromium, zinc, bismuth, nickel and titanium. The content of different element in the aluminum alloy is not more than 10% by weight. Particularly preferred aluminum for use in the present invention are pure aluminum but completely pure aluminum is difficult to produce in view of the refining technique. Accordingly, an extremely small amount of different element may be contained. The composition of aluminum plate used in the present invention is not restricted as described above, and conventionally well-known and commonly used aluminum plates can be appropriately used. The support for use in the present invention has a thickness of from about 0.05 to about 0.6 mm, preferably from 0.1 to 0.4 mm, and more preferably from 0.15 to 0.3 mm.

Prior to surface roughening of an aluminum plate, degreasing treatment for removing rolling oil on the surface of the plate is conducted using a surface active agent, an organic solvent or an alkaline aqueous solution, if desired. Surface roughening treatment of an aluminum plate can be performed by various methods, e.g., a mechanical roughening method, an electrochemical roughening method with dissolving, and a chemical roughening method with selective dissolving. As the mechanical roughening method, well-known methods, e.g., a ball abrading method, a brush abrading method, a blasting method or a buffing method can be used. As the electrochemical roughening method, a method of surface roughening in a hydrochloric acid or nitric acid electrolyte by an alternating current or a direct current can be used. Further, a combination of these methods can be used as described in JP-A-54-63902.

The thus surface-roughened aluminum plate is subjected to alkali etching treatment and neutralizing treatment, and then to anodic oxidation treatment to improve water retentivity and abrasion resistance of the surface, if desired.

Various electrolytes capable of forming a porous oxide film can be used in the anodic oxidation treatment of aluminum plate and, in general, sulfuric acid, hydrochloric acid, oxalic acid, chromic acid and a mixture thereof are used. The concentration of the electrolyte is appropriately determined depending to the kind of electrolyte.

Conditions of the anodic oxidation treatment may vary depending on the electrolyte and are difficult to specify. However, in general, the concentration of electrolyte is from 1 to 80 wt %, the liquid temperature is from 5 to 70° C., the electric current density is from 5 to 60 A/$dm^2$, the voltage is from 1 to 100 V, and the electrolytic time is from 10 seconds to 5 minutes.

An amount of the anodic oxidation film formed is preferably 1.0 $g/m^2$ or more. If the amount of the anodic oxidation film is less than 1.0 $g/m^2$, the resulting lithographic printing plate has an insufficient press life, or the non-image area of the printing plate is liable to be scratched, resulting in the occurrence of "scratch stain" due to adhesion of printing ink on the scratched portion at printing.

In case of using an aluminum or stainless support, it is preferred to provide a heat-isolating layer between the image recording layer (i.e., photo-catalytic metallic compound layer) and the support in order to effectively utilize the heat energy transferred from the light-heat convertible material without divergence. For example, a heat-isolating metal oxide or organic polymer layer having a thickness of 1,000 Å or more may be provided.

In order to ensure adhesion of the image recording layer to the support, a plastic film is subjected to surface treatment, for example corona discharge treatment in a known manner before coating.

Plate-making Method and Printing

Now, a plate-making method on a lithographic printing plate precursor and printing will be described below.

<Overall Irradiation with an Active Ray>

In the present invention, when the entire surface of the image recording layer is not hydrophilic, overall irradiation with an active ray is carried out prior to imagewise exposure to uniformly render the entire surface of the image recording layer hydrophilic. The overall irradiation with an active ray can be conducted by a so-called flood exposure system in which the entire surface is exposed simultaneously or a scanning exposure system in which a light beam is scanned on the entire surface. The later case can be consider the overall irradiation, if the scanning space of beam is so small that problems do not substantially occur at printing. In general, when a laser beam is used as a light source, the beam scanning exposure system is advantageous. On the other hand, the flood exposure system is advantageously performed using a incoherent divegent type light source such as an electric lamp or a discharge tube.

The active ray exciting the thin layer comprising the a photo-catalytic metallic compound as a main component has a photosensitive region at 400 nm or lower. Accordingly, a mercury lamp, a tungsten halogen lamp, other metal halide lamps, a xenon lamp, and a discharge tube emitting an ultraviolet ray can be used as a light source for the active ray. Also, as the excitation light source, a helium cadmium laser having an oscillation wavelength at 325 nm and a water-cooled argon laser having an oscillation wavelength at 351.1 to 363.8 nm can be used. Further, of gallium nitride laser in which near ultraviolet oscillation has been confirmed, InGaN series quantum well semiconductor laser having an oscillation wavelength at 360 to 440 nm, and MgO-$LiNbO_3$ reversed domain wavelength converter type laser having an oscillation wavelength at 360 to 430 nm can also be applied.

In proportion to the amount of irradiation, the photo-catalytic metallic compound constituting the thin layer is gradually changed to hydrophilic by light absorption excitation, and when the photo-catalytic metallic compound which constitutes the thin layer is completely activated, the degree of the hydrophilicity does not proceed further even if the irradiation is continued.

While preferred intensity of the irradiation varies depending on the property of the image recording layer comprising the photo-catalytic metallic compound, the wavelength and the relative spectral distribution of the active ray, in general, the surface exposure strength before being modulated by images for printing is from 0.05 to 100 joule/$cm^2$, preferably from 0.05 to 10 joule/$cm^2$, and more preferably from 0.05 to 5 joule/$cm^2$.

The reciprocity low is almost applied to the irradiation. For example, an exposure of 10 $mW/cm^2$ for 100 seconds and an exposure of 1 $W/cm^2$ for one second provide a substantially same result. Therefore, the light source is not limited as far as it emit the active ray. The amount of irradiation is a quantity applicable to a scanning exposure system using a laser or a flood exposure system using a divergent type light source without any inconvenience.

The photosensitivity which causes the above-described conversion from lipophilicity to hydrophilicity is different from the photosensitivity of the zirconia ceramic described in JP-A-9-169098 in property and mechanism. For example, as to the sensitivity, there is the description in the above patent that a laser beam of 7 $W/\mu m^2$ is used for the zirconia ceramic, which corresponds to 70 joule/$cm^2$ taking the pulse duration of the laser beam to be 100 nanoseconds. The sensitivity of the zirconia ceramic is lower than that of the photo-catalytic metallic compound layer by about one figure. Although the mechanism is not sufficiently clarified, it is believed to be a peeling reaction by light of the oleophilic organic material adhered and is different from the mechanism of change of zirconia by light.

<Imagewise Irradiation and Printing>

The formation of hydrophobic image portion on the hydrophilic entire surface of the printing plate precursor is performed by imagewise irradiation (exposure) with a heat wave such as an infrared laser through an image mask. By the imagewise irradiation, the light-heat convertible material such as minute metal particle is heated and as a result, the polarity of the metallic compound layer changes from hydrophilicity to hydrophobicity in the irradiated region to form an imagewise hydrophobic area (ink-receptive area) on the image recording layer. The exposure amount of imagewise irradiation is so controlled that the light-heat convertible material is not molten by the heat generated thereby.

Writing of image may be conducted any of the flood exposure system and scanning system. The former case includes an infrared ray irradiation system and a system of irradiating the printing plate precursor with a xenon discharge lamp of high illumination intensity for a short time period and generating heat by light-heat conversion. When a flood exposure light source such as an infrared lamp is used, a preferred exposure amount may be vary depending on the illumination intensity. However, in general, the surface exposure intensity before being modulated by images for printing is preferably from 0.1 to 10 $J/cm^2$, more preferably from 0.1 to 1 $J/cm^2$. When a transparent support is used, the exposure may be effected from the back side of the support through the support. It is preferred to select the illumination intensity of exposure so as to reach the above-described exposure intensity with the irradiation time of from 0.01 to 1 msec, preferably from 0.01 to 0.1 msec. When the irradiation time is long, it may be necessary to increase the exposure intensity in view of the competitive relationship between a generating rate of heat energy and a diffusing rate of the generated heat energy.

In the latter case, the scanning is performed on the printing plate precursor using a laser light source containing a large amount of infrared ray component with modulating the laser beam by images for printing. Examples of laser light source include a semiconductor laser, a helium-neon laser, a helium-cadmium laser and a YAG laser. A laser light source having a laser output of from 0.1 to 300 W can be used for the irradiation. When a pulse laser is used, it is preferred to perform the irradiation with laser beam having a peak output of 1,000 W, preferably 2,000 W. Regarding exposure amount, the surface exposure intensity before being modulated by images for printing is ordinarily from 0.1 to 10 J/cm$^2$, preferably from 0.5 to 5 J/cm$^2$, more preferably from 0.3 to 1 J/Cm$^2$. When a transparent support is used, exposure may also be effected from the back side of the support through the support.

In the plate-making procedure of a lithographic printing plate, after the image exposure, a step called gumming is carried out by coating a surface finishing solution containing a plate surface protective agent (so-called gumming solution) on the plate surface for protecting the non-image area, if desired. The gumming is performed for various purposes, e.g., for preventing the deterioration of the hydrophilicity of the hydrophilic surface of the lithographic printing plate under the influence of a small amount of contaminants in the air, for increasing the hydrophilicity of the non-image area, for preventing the deterioration of the lithographic printing plate during the time after the plate-making until printing or after interrupting printing until restart, for preventing the non-image area from becoming ink-receptive and smearing due to adhesion of oil transferred from fingers and ink during handling of the printing plate, for example, in the case of mounting the printing plate on a printing machine, and for preventing the occurrence of scratch on the non-image area and the image area during handling of the printing plate.

Preferred examples of the water-soluble resin having a film-forming property for use in the plate surface protective agent according to the present invention include gum arabic, a cellulose derivative (e.g., carboxymethyl cellulose, carboxyethyl cellulose or methyl cellulose) and a modified product thereof, polyvinyl alcohol and a derivative thereof, polyvinyl pyrrolidone, polyacrylamide and a copolymer thereof, an acrylic acid copolymer, vinylmethyl ether-maleic anhydride copolymer, vinyl acetate-maleic anhydride copolymer, styrene-maleic anhydride copolymer, calcined dextrin, enzyme-decomposed dextrin, and enzyme-decomposed etherified dextrin.

The content of the above-described water-soluble resin in the protective agent in the surface-finishing solution is generally from 3 to 25 wt %, preferably from 10 to 25 wt %.

The above-described water-soluble resins may be used in mixture of two or more in the present invention.

The plate surface protective agent for a lithographic printing plate may contain various surfactants. Anionic surfactants and nonionic surfactants can be used. Examples of the anionic surfactant include an aliphatic alcohol sulfate, tartaric acid, malic acid, lactic acid, levulinic acid and an organic sulfonic acid. Also, a mineral acid, e.g., nitric acid, sulfuric acid and phosphoric acid is useful. Two or more of the mineral acids, organic acids and inorganic salts may be used in combination.

In addition, a lower polyhydric alcohol such as glycerol, ethylene glycol and triethylene glycol can be used as a wetting agent in the protective agent, if desired. The content of the wetting agent in the protective agent is ordinarily from 0.1 to 5.0 wt %, preferably from 0.5 to 3.0 wt %. Besides the above-described compounds, the plate surface protective agent for a lithographic printing plate according to the present invention may contain a preservative, e.g., benzoic acid and a derivative thereof, phenol, formaldehyde and sodium dehydroacetate, in an amount of from 0.005 to 2.0 wt %.

A defoaming agent may be added to the plate surface protective agent. An organic silicone compound is preferably used as the defoaming agent and the amount therof is preferably from 0.0001 to 0.1 wt %.

For preventing decrease in the oil-sensitivity of the image area, the plate surface protective agent may contain an organic solvent. A preferred organic solvent is one which is hardly soluble in water and includes a petroleum fraction having a boiling point of from about 120 to about 250° C., and a plasticizer having a freezing point of 15° C. or less and a boiling point of 300° C. or more, e.g., dibutyl phthalate and dioctyl adipate. The organic solvent is added in an amount of from 0.05 to 5 wt %.

The plate surface protective agent may take any form of a homogeneous solution type, a suspension type and an emulsion type. The emulsion type containing the organic solvent described above exhibits excellent characteristics. In such a case, it is preferred to contain a surface active agent in combination as described in JP-A-55-105581.

A printing plate precursor which has been subjected to image exposure, water development, and gumming, if desired, is mounted on a printing machine and printing can be immediately performed. Further, a printing plate precursor can be mounted on a printing machine immediately after exposure and printing can be performed without undergoing the development step. Alternatively, after mounting a printing plate precursor on a printing machine, a printing plate can be prepared on the machine by performing imagewise scanning exposure with a laser beam. That is, in the plate-making method using the lithographic printing plate precursor according to the present invention, a lithographic printing plate can be prepared without undergoing development processing.

Reclamation of Printing Plate Precursor

Reclamation of a printing plate precursor from a printing plate after printing is described below.

The printing ink adhered to the printing plate after printing is removed by cleaning using a hydrophobic petroleum-based solvent. As the solvent, a commercially available printing ink dissolving solution such as an aromatic hydrocarbon, e.g., kerosine and Isopar, can be used. Benzene, toluene, xylene, acetone, methyl ethyl ketone and a mixture thereof may also be used.

The printing plate having been subjected to the removal of printing ink is stored for the next printing so as to keep it away from exposure to high temperature.

The printing plate having been subjected to the removal of printing ink is subjected to overall irradiation with an active ray as described above, thereby rendering the entire surface hydrophilic. The thus-reproduced printing plate precursor is again subjected to imagewise irradiation of heat mode to prepare a printing plate which is used in printing.

Another method for rendering the surface hydrophilic is a method utilizing the property of the photo-catalytic metallic compound in that when the photo-catalytic metallic compound is heated over at the high temperature generating hydrophobicity, it again exhibits hydrophilicity as described above. Specifically, after removing printing ink, the printing plate is heated at the high temperature generating hydrophilicity, thereby reproducing a printing plate precursor. While the temperature generating hydrophilicity may be varied depending on the kind or hysteresis of the metallic compound, it is generally 170° C. or more, usually 200° C. or more. The time necessary for obtaining hydrophilicity is in a range of from about 2 to about 30 minutes. As the temperature for heating is high, the desired hydrophilicity is obtained in a short time.

The number of times of recycling of the printing plate precursor according to the present invention is at least 15 times, although it is not completely grasped. It is believed that the time is restricted by unremovable stains, scratches on the surface of the plate and mechanical deformation (distortion) of the plate.

According to the method of the present invention, development processing is not demanded, a plate-making is simple and a printing plate precursor can be directly mounted on a printing machine for the plate-making, and a lithographic printing plate which is excellent in press life and provides printed matter of less stain is obtained.

The lithographic printing plate precursor is subjected to plate-making in a simple manner by a scanning image exposure system using a laser beam and the resulting lithographic printing plate has excellent discrimination of an image area from a non-image area.

Also, the lithographic printing plate can be repeatedly employed.

The present invention will be described in grater detail with reference to the following examples, but the present invention should not be construed as being limited thereto.

EXAMPLE 1

A polyethylene terephthalate (PET) support having a thickness of 150 μm was set in a sputtering apparatus and evacuated to $5\times10^{-7}$ Torr. The support was heated at 150° C., argon/oxygen mixed gas (30/70 by molar ratio) was introduced to the apparatus, and the gas pressure was adjusted to $5\times10^{-3}$ Torr. RF power of 200 W was applied to a titanium target having a diameter of 5 inches, thus a titanium oxide thin film having a thickness of 1,000 Å was formed.

The thus-obtained sample was heated in an oven at 120° C. for 3 hours, and then allowed to stand to cool. After the temperature of the sample was lowered to a room temperature, the sample was immersed in an aqueous solution containing 1 mol/liter of silver nitrate put in a transparent quart glass vessel and subjected to irradiation with a high-pressure mercury lamp through the quart glass vessel so as to irradiate the surface of the titanium oxide thin film with an ultraviolet ray at intensity of 1.35 mW/cm$^2$ for 2 minutes. After the treatment, the sample was thoroughly washed with pure water, dried with cool air and allowed to stand in a dark place for one hour. As a result of observation of a photograph of electron microscope of the surface, it was found that the minute silver particles deposited on the surface of the titanium oxide thin film covered about 3% of the entire surface thereof. The sample was then subjected to the overall irradiation with a high-pressure mercury lamp at intensity of 1.37 mW/cm$^2$ for 5 minutes, thereby preparing a printing plate precursor.

The printing plate precursor was exposed (imagewise irradiation) using an LD laser light source of 908 nm on the following conditions.

Output: 750 mW

Laser beam diameter: 28 μm

Scanning speed: 270 cm/sec

The printing plate thus-prepared was set in an Oliver 52 single-sided printing machine (manufactured by Sakurai Co., Ltd.), pure water was supplied as dampening water on the printing plate surface with rotating a molten roller 20 times, and an ink roller was touched to the printing plate surface and offset printing was performed. Printing ink used was New Champion F Gloss 85 Black (manufactured by Dainippon Ink and Chemicals, Inc.). In the course of performing the offset printing of 1,000 sheets, from the beginning to end of printing, the printing ink adhered well to the laser-exposed area and the non-exposed area was not stained, thus clear printed matter was obtained. A scratch on the printing plate was not observed.

The surface of the printing plate was then cleaned carefully using waste impregnated with a mixture of printing ink cleaner (Dai-Clean R, manufactured by Dainippon Ink and Chemicals, Inc.) and toluene (1:1) to remove the printing ink. The printing plate was then heated in an oven at 120° C. for 3 hours and allowed to stand for cooling to a room temperature.

The cycle of the overall irradiation with the active ray, the image exposure (imagewise irradiation) by a laser beam and the offset printing was repeated three times using the reclaimed printing plate precursor.

Printed matter obtained by the repetition was also clear similar to that obtained in the first printing, and printing ink adhered well to the laser-exposed area and the non-exposed area was not stained. A scratch on the printing plate was not observed.

COMPARATIVE EXAMPLE 1

A polyethylene terephthalate (PET) support having a thickness of 150 μm was set in a sputtering apparatus and evacuated to $5\times10^{-7}$ Torr. A titanium oxide thin film having a thickness of 1,000 Å was formed under the same conditions as in Example 1. The sample was heated in an oven at 120° C. for 3 hours, and then allowed to stand to cool. After the temperature of the sample was lowered to a room temperature, it was subjected to the overall irradiation with a high-pressure mercury lamp at intensity of 1.37 mW/cm$^2$ for 5 minutes in the same manner as in Example 1 provided that the treatment for depositing the minute metallic silver particles on the surface of the titanium oxide thin film was omitted. The resulting printing plate precursor was exposed (imagewise irradiation) using the LD laser light source of 908 nm in the same manner as in Example 1.

The printing plate thus-prepared was set in an Oliver 52 single-sided printer (manufactured by Sakurai Co., Ltd.), and offset printing was performed under the same conditions as in Example 1. The printed matter obtained was not clear, discrimination of the laser-irradiated area from the non-irradiated area was insufficient, and printing ink did not adhere well to the laser-irradiated area.

From the results shown in Example 1 and Comparative Example 1, it can be seen that according to the method of the present invention, the entire surface of the printing plate precursor becomes hydrophilic by the overall irradiation with the active ray, and then the light-heat convertible material on the printing plate precursor is imagewise irradiated with a laser beam to make the irradiated area of the printing plate precursor hydrophobic (oleophilic), whereby offset printing can be effected. It is also understood that the printing plate precursor of the present invention can be reclaimed by the removal of printing ink with cleaning and the overall irradiation with the active ray.

EXAMPLE 2

A printing plate precursor was prepared in the same manner as in Example 1 except for changing the conditions of heat treatment in the oven after removing printing ink at 220° C. for 10 minutes. Using the printing plate precursor, the imagewise irradiation and offset printing were performed in the same manner as in Example 1 except for eliminating the overall irradiation with the active ray. Then, the cycle of these procedures was repeated three times. During the cycle of procedures, the overall irradiation with the active ray was not conducted at all.

Printed matter obtained by the repetition was also clear similar to that obtained in the first printing, and printing ink adhered well to the laser-exposed area and the non-exposed area was not stained. A scratch on the printing plate was not observed.

The results obtained in Example 2 show that the method of heating the printing plate after removing printing ink at the high temperature generating hydrophilicity is also usable for reclaiming a printing plate precursor as well as the method of reclamation by the irradiation with the active ray.

EXAMPLE 3

<Preparation of Support>

A rolled plate having a thickness of 0.30 mm of aluminum material of JIS A1050 containing 99.5% by weight of aluminum, 0.01% by weight of copper, 0.03% by weight of titanium, 0.3% by weight of iron, and 0.1% by weight of silicon was surface-grained using a 20% by weight aqueous suspension of 400 mesh pamiston (manufactured by Kyoritsu Yogyo K.K.) and a rotary nylon brush (6,10-nylon), and then was thoroughly washed with water.

The plate was immersed in a 15% by weight aqueous solution of sodium hydroxide (containing 4.5% by weight of aluminum) and etched so as to reach the dissolving amount of aluminum of 5 $g/m^2$, followed by washing with running water. Then, the plate was neutralized with 1% by weight nitric acid and subsequently, it was subjected to electrolytic graining treatment in a 0.7% by weight aqueous nitric acid solution (containing 0.5% by weight of aluminum) using rectangular alternating wave form voltage (an electric current ratio: r=0.90, an electric current wave form: that described in JP-B-58-5796 (the term "JP-B" as used herein means an "examined Japanese patent publication")) of the anode time voltage of 10.5 V and the cathode time voltage of 9.3 V, with the quantity of electricity of the anode time of 160 $coulomb/dm^2$. After washing with water, the plate was immersed in a 10% by weight aqueous solution of sodium hydroxide at 35° C. and etched so as to reach the dissolving amount of aluminum of 1 $g/m^2$, followed by washing with water. The plate was immersed in a 30% by weight aqueous sulfuric acid solution at 50° C., desmutted, and washed with water.

Further, the plate was subjected to porous anodic oxidation film-forming treatment in a 20% by weight aqueous sulfuric acid solution (containing 0.8% by weight aluminum) at 35° C. using direct current. Specifically, electrolysis was conducted at electric current density of 13 $A/dm^2$ and 2.7 $g/m^2$ of anodic oxidation film weight was obtained by controlling the time for electrolysis.

The reflection density of the thus-prepared aluminum support measured by a Macbeth RD 920 reflection densitometer was 0.30, and the center line average roughness thereof was 0.58 $\mu$m.

<Photo-catalytic Metallic Compound Thin Layer>

The aluminum support was set in a sputtering apparatus and evacuated to $5\times10^{-7}$ Torr. The support was heated at 500° C., $Ar/O_2$ gas (60/40 by molar ratio) was introduced and the gas pressure was adjusted to $5\times10^{-3}$ Torr. RF power of 200 W was applied to a sintered target of barium titanate having a diameter of 6 inches, thus a barium titanate thin film having a thickness of 2,000 Å was formed. It was found that the resulting thin film had the polycrystalline structure as a result of the X-ray analysis.

<Deposition of Light-heat Convertible Minute Metal Particles>

The aluminum support having the barium titanate thin film was immersed in an aqueous metal salt solution having the composition shown below, and irradiated with a high-pressure mercury lamp of 100 W through a pyrex glass cutting a short wavelength range for 0.5 minutes to deposit black metallic silver on the surface of the barium titanate thin film. The surface of the resulting printing plate precursor bearing the minute metallic silver particles was highly hydrophilic and a contact angle of water drop on the surface was 9 degrees.

| | |
|---|---|
| 10% Aqueous solution of polyvinyl alcohol (PVA 117 manufactured by Kuraray Co., Ltd.) | 10.1 g |
| Glyoxal | 0.8 g |
| 1N Aqueous solution of silver nitrate | 8.4 g |
| 5% Aqueous solution of surface active agent K | 0.3 g |
| Water | 13.7 g |

Surface active agent K: Polyethylene glycol p-nonylphenyl ether (average number of oxyethylene group: 8.5).

<Imagewise Exposure>

The imagewise exposure was performed using the LD laser light source in the same manner as in Example 1. A contact angle of water drop on the surface of the exposed area of the printing plate precursor was 75 degrees. In the exposed area, the surface of the printing plate precursor became highly hydrophobic.

<Printing>

Printing was performed using a RYOBI-3200MCD printing machine. As dampening water, an 1 vol % aqueous solution of EU-3 (manufactured by Fuji Photo Film Co., Ltd.) was used, and GEOS (N) black was used as printing ink. After 10 sheets were printed from the start, an excellent printed matter was obtained in which adhesion of the ink to the dot part and the solid part was uniform and background stain was not observed in the non-image area. Further, 10,000 sheets of printed matter of high quality without the occurrence of stain were obtained.

EXAMPLE 4

The aluminum support prepared in Example 3 was placed in a vacuum deposition apparatus and thereon a titanium dioxide thin film was deposited by heating a titanium metal piece under the condition that the total pressure was $1.5\times10^{-4}$ Torr and the partial pressure of oxygen gas was 70%. As a result of the X-ray analysis, the crystalline structure of the thus-formed thin film was found to have an amorphous/anatase/rutile ratio of 1.5/6.5/2. The thickness of the titanium dioxide thin film was 900 Å. On the support were deposited the light-heat convertible minute metal particles to prepare a printing plate precursor in the same manner as in Example 3. The surface of the printing plate precursor was highly hydrophilic and a contact angle of water drop on the surface was 10 degrees.

<Imagewise Exposure>

The imagewise exposure was conducted in the same manner as in Example 1. A contact angle of water drop on the surface of the exposed area of the printing plate precursor was 90 degrees. In the exposed area, the surface of the printing plate precursor became highly hydrophobic.

<Printing>

The printing was performed in the same manner as in Example 1. After 10 sheets were printed from the start, an excellent printed matter was obtained in which adhesion of the ink to the dot part and the solid part was uniform and background stain was not observed in the non-image area. Further, 10,000 sheets of printed matter of high quality without the occurrence of stain were obtained.

EXAMPLE 5

A polyethylene terephthalate (PET) support having a thickness of 200 μm was set in a sputtering apparatus and evacuated to $5\times10^{-7}$ Torr. The support was heated at 120° C., argon/oxygen mixed gas (50/50 by molar ratio) was introduced to the apparatus, and the gas pressure was adjusted to $5\times10^{-3}$ Torr. RF power of 150 W was applied to a sintered target of tin oxide ($SnO_2$) having a diameter of 6 inches, thus a tin oxide thin film having a thickness of 1,000 Å was formed.

<Deposition of Light-heat Convertible Minute Particles>

The polyethylene terephthalate support having the tin oxide thin film was immersed in an aqueous metal salt solution having the composition shown below, and irradiated with a high-pressure mercury lamp of 100 W through a pyrex glass cutting a short wavelength range for one minute to deposit metallic silver on the surface of the tin oxide thin film, thereby preparing a printing plate precursor. The surface of the printing plate precursor was highly hydrophilic and a contact angle of water drop on the surface was 13 degrees.

| | |
|---|---|
| 10% Aqueous solution polyacrylic acid | 10.1 g |
| Glyoxal | 0.8 g |
| 1N Aqueous solution of silver nitrate | 8.4 g |
| 5% Aqueous solution of surface active agent K | 0.3 g |
| Water | 13.7 g |

Surface active agent K: Polyethylene glycol p-nonylphenyl ether (average number of oxyethylene grpup: 8.5)

<Imagewise Exposure>

The imagewise exposure was performed in the same manner as in Example 1. A contact angle of water drop on the surface of the exposed area of the printing plate precursor was 90 degrees. In the exposed area, the surface of the printing plate precursor became highly hydrophobic.

<Printing>

The printing was performed in the same manner as in Example 1. After 10 sheets were printed from the start, an excellent printed matter was obtained in which adhesion of the ink to the dot part and the solid part was uniform and background stain was not observed in the non-image area. Further, 2,000 sheets of printed matter of high quality without the occurrence of stain were obtained.

EXAMPLE 6

The aluminum support having the anodic oxidation film as described in Example 3 was immersed in a 20% ethanol solution containing cesium ethoxide, titanium butoxide, lanthanum isobutoxide and niobium ethoxide stoichiometrically corresponding to $CsLa_2NbTi_2O_{10}$ to hydrolyze the surface thereof, followed by heating at 260° C., thus a thin film of $CsLa_2NbTi_2O_{10}$ having a thickness of 1,000 Å was formed on the surface of the aluminum support.

In the same manner as in Example 1 except for using the aluminum support having the complex metal oxide thin layer in place of the polyethylene terephthalate support used in Example 1, a printing plate precursor having minute silver particles on the complex metal oxide thin layer was prepared. The surface of the printing plate precursor bearing the minute metallic silver particles was highly hydrophilic and a contact angle of water drop on the surface was 14 degrees.

<Imagewise Exposure>

The imagewise exposure to the printing plate precursor was performed in the same manner as in Example 1. A contact angle of water drop on the surface of the exposed area of the printing plate precursor was 85 degrees. In the exposed area, the surface of the printing plate precursor became highly hydrophobic.

<Printing>

The printing was performed in the same manner as in Example 1. After 10 sheets were printed from the start, an excellent printed matter was obtained in which adhesion of the ink to the dot part and the solid part was uniform and background stain was not observed in the non-image area. Further, 5,000 sheets of printed matter of high quality without the occurrence of stain were obtained.

EXAMPLE 7

In the same manner as in Example 6 except for using a stainless steel plate having a thickness of 100 μm in place of the aluminum support having the anodic oxidation film used in Example 6 to prepare a printing plate precursor. Specifically, the stainless steel plate was immersed in a 20% ethanol solution containing cesium ethoxide, titanium butoxide, lanthanum isobutoxide and niobium ethoxide stoichiometrically corresponding to $CsLa_2NbTi_2O_{10}$ to hydrolyze the surface thereof, followed by heating at 250° C., thus a thin layer of $CsLa_2NbTi_2O_{10}$ having a thickness of 1,000 Å was formed on the surface of the stainless steel support.

<Deposition of Light-heat Convertible Minute Metal Particles>

The stainless steel support having the complex metal oxide thin layer was immersed in an aqueous solution for depositing minute metal particles having the composition shown below at 30° C. for one minute without the irradiation with the active ray to deposit minute silver particles on the surface of the photo-catalytic thin layer to prepare a printing plate precursor. The surface of the printing plate precursor bearing the minute metallic silver particles was highly hydrophilic and a contact angle of water drop on the surface was 11 degrees.

| | |
|---|---|
| Aqueous solution of silver nitrate | 1 mole |
| Ammonium hydroxide | 24 moles |
| Glucose | 1 mole |
| Water | 1 liter |

<Imagewise Exposure>

The imagewise exposure to the printing plate precursor was performed in the same manner as in Example 1. A contact angle of water drop on the surface of the exposed area of the printing plate precursor was 80 degrees. In the exposed area, the surface of the printing plate precursor became highly hydrophobic.

<Printing>

The printing was performed in the same manner as in Example 1. After 10 sheets were printed from the start, an excellent printed matter was obtained in which adhesion of the ink to the dot part and the solid part was uniform and background stain was not observed in the non-image area. Further, 2,000 sheets of printed matter of high quality without the occurrence of stain were obtained.

EXAMPLE 8

In the same manner as in Example 7 except for immersing the stainless steel support having the complex metal oxide thin layer in a mixture of an equal amount of an aqueous solution of copper ammonia complex salt shown below and an aqueous solution of reducing agent as shown below, wherein both solutions had been mixed just before the immersion, in place of immersing the aqueous silver, ammonia and glucose solution as in Example 7, minute copper particles were deposited on the surface of the photo-catalytic thin layer to prepare a printing plate precursor. The surface of the printing plate precursor bearing the minute copper particles was highly hydrophilic and a contact angle of water drop on the surface was 15 degrees.

Aqueous Solution of Copper Ammonia Complex Salt

In 800 ml of water was dissolved 0.5 mol of copper sulfate, and to the solution was added one mol of ammonium sulfate. The pH of the solution was adjusted to 11 using a 28% aqueous ammonia and water was added thereto to make up one liter.

Aqueous Solution of Reducing Agent

In 800 ml of water were dissolved 50 g of potato starch and 60 g of potassium hydroxide and water was added thereto to make up one liter.

<Imagewise Exposure>

The imagewise exposure to the printing plate precursor was performed in the same manner as in Example 1. A contact angle of water drop on the surface of the exposed area of the printing plate precursor was 90 degrees. In the exposed area, the surface of the printing plate precursor became highly hydrophobic.

<Printing>

The printing was performed in the same manner as in Example 1. After 10 sheets were printed from the start, an excellent printed matter was obtained in which adhesion of the ink to the dot part and the solid part was uniform and background stain was not observed in the non-image area. Further, 2,000 sheets of printed matter of high quality without the occurrence of stain were obtained.

EXAMPLE 9

In the same manner as in Example 7 except for immersing the stainless steel support having the complex metal oxide thin layer in a dispersion prepared by dispersing finely pulverized infrared absorbing dye shown below in a 0.2% aqueous sodium dodecylbenzenesulfonate solution wherein a content of the dye was 1%, in place of immersing the aqueous silver, ammonia and glucose solution as in Example 7, minute dye particles were deposited on the surface of the photo-catalytic thin layer to prepare a printing plate precursor. The surface of the printing plate precursor bearing the minute dye particles was highly hydrophilic and a contact angle of water drop on the surface was 15 degrees.

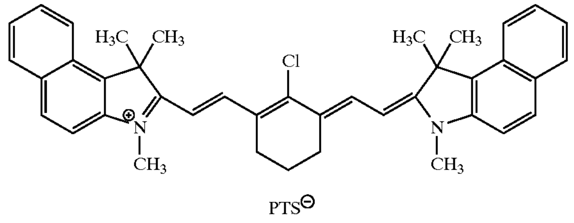

<Imagewise Exposure>

The imagewise exposure to the printing plate precursor was performed in the same manner as in Example 1. A contact angle of water drop on the surface of the exposed area of the printing plate precursor was 80 degrees. In the exposed area, the surface of the printing plate precursor became highly hydrophobic.

<Printing>

The printing was performed in the same manner as in Example 1. After 10 sheets were printed from the start, an excellent printed matter was obtained in which adhesion of the ink to the dot part and the solid part was uniform and background stain was not observed in the non-image area. Further, 2,500 sheets of printed matter of high quality without the occurrence of stain were obtained.

EXAMPLE 10

In the same manner as in Example 7 except for immersing the stainless steel support having the complex metal oxide thin layer in a dispersion prepared by dispersing iron oxide red (tri-iron tetraoxide) powder in a 0.2% aqueous sodium dodecylbenzenesulfonate solution wherein the content of the iron oxide red was 1%, in place of immersing the aqueous silver, ammonia and glucose solution as in Example 7, minute iron oxide red particles were deposited on the surface of the photo-catalytic thin layer to prepare a printing plate precursor. The surface of the printing plate precursor bearing the minute iron oxide red particles was highly hydrophilic and a contact angle of water drop on the surface was 15 degrees.

<Imagewise Exposure>

The imagewise exposure was performed in the same manner as in Example 1. A contact angle of water drop on the surface of the exposed area of the printing plate precursor was 90 degrees. In the exposed area, the surface of the printing plate precursor became highly hydrophobic.

<Printing>

The printing was performed in the same manner as in Example 1. After 10 sheets were printed from the start, an excellent printed matter was obtained in which adhesion of the ink to the dot part and the solid part was uniform and background stain was not observed in the non-image area. Further, 5,000 sheets of printed matter of high quality without the occurrence of stain were obtained.

EXAMPLE 11

<Preparation of Printing Plate Precursor and Plate-making>

While the formation of the barium titanate thin layer on the aluminum support, the formation of the minute black metallic silver particles thereon and the heat mode imagewise exposure were conducted in Example 3, in the present example, after the formation of the minute black metallic silver particles on the surface the barium titanate thin layer and before the heat mode imagewise exposure, the printing plate precursor was heated at 200° C. for one minute. Other procedures except for the heat treatment were conducted in the same manner as in Example 3 to prepare a printing plate precursor.

The surface of the printing plate precursor before the imagewise exposure was hydrophilic and exhibited a contact angle of water drop thereon of 10 degrees. On the other hand, a contact angle of water drop on the surface of the imagewise exposed area was 80 degrees and exhibited remarkable hydrophobicity.

<Printing>

The printing was conducted in the same manner as in Example 3. The number of printed matter having the high quality without stain obtained was three times as many as that of Example 3. From the comparison of these examples, it can be seen that press life of the printing plate can be more improved by performing the heat treatment to firmly adhere the minute silver particles onto the surface of the photo-catalytic thin layer.

EXAMPLE 12

<Photo-catalytic Metallic Compound Thin Layer>

The aluminum support having the anodic oxidation film as described in Example 3 was set in a sputtering apparatus and evacuated to $5\times10^{-7}$ Torr. The support was heated at 500° C., $Ar/O_2$ gas (60/40 by molar ratio) was introduced, and the gas pressure was adjusted to $5\times10^{-3}$ Torr. RF power of 200 W was applied to a crystalline silica target, thus a silicon oxide ($SiO_2$) thin film having a thickness of 3,000 Å was formed.

<Deposition of Light-heat Convertible Minute Metal Particles>

On the silicon oxide thin film, a titanium oxide thin film was deposited in the same manner as in Example 4, followed by the same procedures as in Example 4, except for reducing the output of laser for the imagewise exposure to ½ of that in Example 4.

The contact angle of water drop, stain on printed matter and press life were substantially same as those in Example 4. Specifically, by introducing the heat-isolating layer between the titanium oxide thin layer and the aluminum support having a high heat conductivity, the photosensitivity in heat mode increased, and the good printing quality and press life were maintained in the same level even when the intensity of imagewise exposure was reduced.

While the invention has been described in detail and with reference to specific examples thereof, it will be apparent to one skilled in the art that various changes and modifications can be made therein without departing from the spirit and scope thereof.

What is claimed is:

1. A method of producing a lithographic printing plate which comprises subjecting a printing plate precursor comprising a support having a metallic compound layer which has a photo-catalytic property and a hydrophilic surface and bears light-heat convertible minute particles on the surface thereof to imagewise irradiation of heat mode to convert polarity of the metallic compound layer, thereby forming an imagewise hydrophobic region.

2. The method of producing a lithographic printing plate as claimed in claim 1, wherein the metallic compound layer which has a photo-catalytic property and a hydrophilic surface and bears light-heat convertible minute particles on the surface thereof is one formed by irradiating a metallic compound layer having a photo-catalytic property with an active ray in the presence of a water soluble salt of metal which constitutes the light-heat convertible minute particles.

3. The method of producing a lithographic printing plate as claimed in claim 1, wherein a covering rate of the light-heat convertible minute particles born on the surface of the metallic compound layer which has a photo-catalytic property and a hydrophilic surface is in a range of from 0.01 to 10% of the surface of the metallic compound layer.

4. The method of producing a lithographic printing plate as claimed in claim 1, wherein the printing plate precursor is one formed by removing printing ink from a lithographic printing plate produced according to the method as claimed in claim 1 after conducting printing, and then subjecting the metallic compound layer of the lithographic printing plate to overall irradiation with an active ray, thereby rendering the surface of the metallic compound layer hydrophilic.

5. The method of producing a lithographic printing plate as claimed in claim 1, wherein the printing plate precursor is one formed by removing printing ink from a lithographic printing plate produced according to the method as claimed in claim 1 after conducting printing, and then subjecting the metallic compound layer of the lithographic printing plate to heating at the high temperature generating hydrophilicity, thereby rendering the surface of the metallic compound layer hydrophilic.

6. The method of producing a lithographic printing plate as claimed in claim 1, wherein the metallic compound layer comprises a metallic compound which has a property of subjecting excitation of an electron energy level to increase reactivity upon absorption of an active ray.

7. The method of producing a lithographic printing plate as claimed in claim 1, wherein the metallic compound layer comprises a metallic compound selected from $TiO_2$, $RTiO_3$, $AB_{2-x}C_xD_{3-x}E_xO_{10}$, $SnO_2$, $MoS_2$, $MoSe_2$, $ZrO_2$, ZnO, ZnS, CdS, CdSe, PbS, SiC, $Bi_2O_3$, $WO_3$ and $Fe_2O_3$, wherein R represents an alkaline earth metal atom, A represents a hydrogen atom or an alkali metal atom, B represents an alkaline earth metal atom or a lead atom, C represents a rare earth atom, D represents a metal atom belonging to Group 5A of the Periodic Table, E represents a metal atom belonging to Group 4 of the Periodic Table and x represents a number from 0 to 2.

8. The method of producing a lithographic printing plate as claimed in claim 1, wherein a thickness of the metallic compound layer is from 1 to 100,000 Å.

* * * * *